US012751175B2

(12) United States Patent
Fukuda

(10) Patent No.: US 12,751,175 B2
(45) Date of Patent: Sep. 29, 2026

(54) DISPLAY DEVICE WITH A RIB HAVING A PARTITION WITH A CONDUCTIVE PORTION AND MANUFACTURING METHOD THEREOF

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 550 days.

(21) Appl. No.: 18/295,283

(22) Filed: Apr. 4, 2023

(65) Prior Publication Data

US 2023/0320172 A1 Oct. 5, 2023

(30) Foreign Application Priority Data

Apr. 5, 2022 (JP) ................................ 2022-063015

(51) Int. Cl.
*H10K 59/80* (2023.01)
*H10K 71/00* (2023.01)
*H10K 102/00* (2023.01)

(52) U.S. Cl.
CPC . *H10K 59/80515* (2023.02); *H10K 59/80521* (2023.02); *H10K 71/00* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1 | 1/2009 | Takata | |
| 2011/0304656 | A1 | 12/2011 | Ueki et al. | |
| 2019/0363275 | A1 | 11/2019 | Ochi et al. | |
| 2020/0066699 | A1 | 2/2020 | Kim et al. | |
| 2021/0091328 | A1* | 3/2021 | Sakamoto .......... | H10K 59/8051 |
| 2022/0077251 | A1* | 3/2022 | Choung ............... | H10K 59/122 |

(Continued)

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |

(Continued)

OTHER PUBLICATIONS

Indian Office Action issued Oct. 31, 2025, in corresponding IN Application No. 202314025514, 10pp.

*Primary Examiner* — Sue A Purvis
*Assistant Examiner* — Seyon Ali-Simah Punchbeddell
(74) *Attorney, Agent, or Firm* — XSENSUS LLP

(57) ABSTRACT

According to one embodiment, a display device includes a lower electrode, a rib including a pixel aperture, a partition on the rib, an upper electrode, and an organic layer between the lower electrode and the upper electrode. The partition includes a conductive first portion, a conductive second portion which is provided on the first portion and is in contact with the upper electrode, and a third portion provided on the second portion. A lower end of the second portion protrudes in a width direction of the partition relative to the first portion. The third portion protrudes in the width direction relative to an upper end of the second portion.

13 Claims, 38 Drawing Sheets

(56) References Cited

U.S. PATENT DOCUMENTS

| | | | | |
|---|---|---|---|---|
| 2022/0344417 | A1* | 10/2022 | Choung | H10K 59/80522 |
| 2023/0263014 | A1* | 8/2023 | Lin | H10K 59/122<br>257/40 |

FOREIGN PATENT DOCUMENTS

| | | | |
|---|---|---|---|
| JP | 2009-32673 | A | 2/2009 |
| JP | 2010-118191 | A | 5/2010 |
| KR | 20080037926 | A | 5/2008 |
| WO | 2018/179308 | A1 | 10/2018 |

* cited by examiner

DISPLAY DEVICE WITH A RIB HAVING A PARTITION WITH A CONDUCTIVE PORTION AND MANUFACTURING METHOD THEREOF

CROSS-REFERENCE TO RELATED APPLICATIONS

This application is based upon and claims the benefit of priority from Japanese Patent Application No. 2022-063015, filed Apr. 5, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which prevents the reduction in reliability is required.

DETAILED DESCRIPTION

Figure 1:
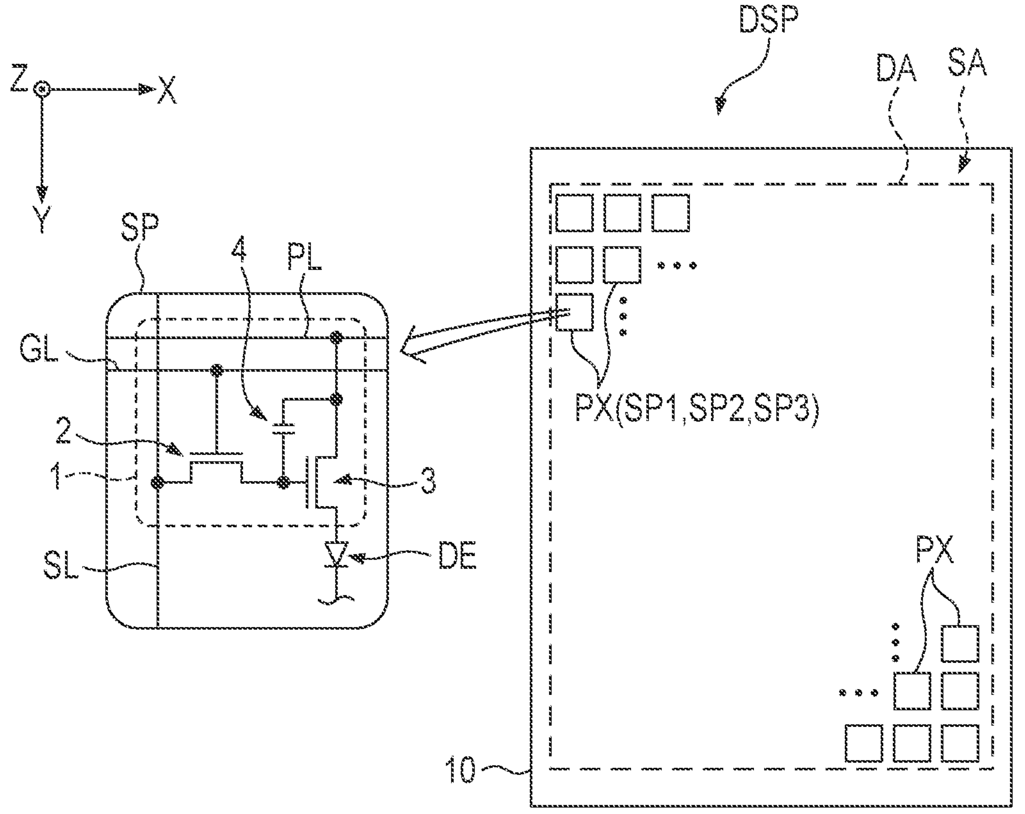
FIG. 1 is a diagram showing a configuration example of a display device according to a first embodiment.

In general, according to one embodiment, a display device comprises a lower electrode, a rib comprising a pixel aperture overlapping the lower electrode, a partition provided on the rib, an upper electrode facing the lower electrode, and an organic layer which is located between the lower electrode and the upper electrode and emits light based on a potential difference between the lower electrode and the upper electrode. The partition comprises a conductive first portion, a conductive second portion which is provided on the first portion and is in contact with the upper electrode, and a third portion provided on the second portion. A lower end of the second portion protrudes in a width direction of the partition relative to the first portion. The third portion protrudes in the width direction relative to an upper end of the second portion.

According to another embodiment, a manufacturing method of a display device includes forming a lower electrode, forming a rib which covers at least part of the lower electrode, forming a partition on the rib, the partition comprising a conductive first portion, a conductive second portion provided on the first portion and a third portion provided on the second portion, the second portion comprising a lower end protruding in a width direction relative to the first portion, the third portion protruding in the width direction relative to an upper end of the second portion, forming an organic layer which covers the lower electrode through a pixel aperture provided in the rib, and forming an upper electrode which covers the organic layer and is in contact with the second portion.

This configuration can improve the reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. A plan view is defined as appearance when various types of elements are viewed parallel to the third direction Z.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resin film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red first subpixel SP1, a green second subpixel SP2 and a blue third subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

Figure 2:
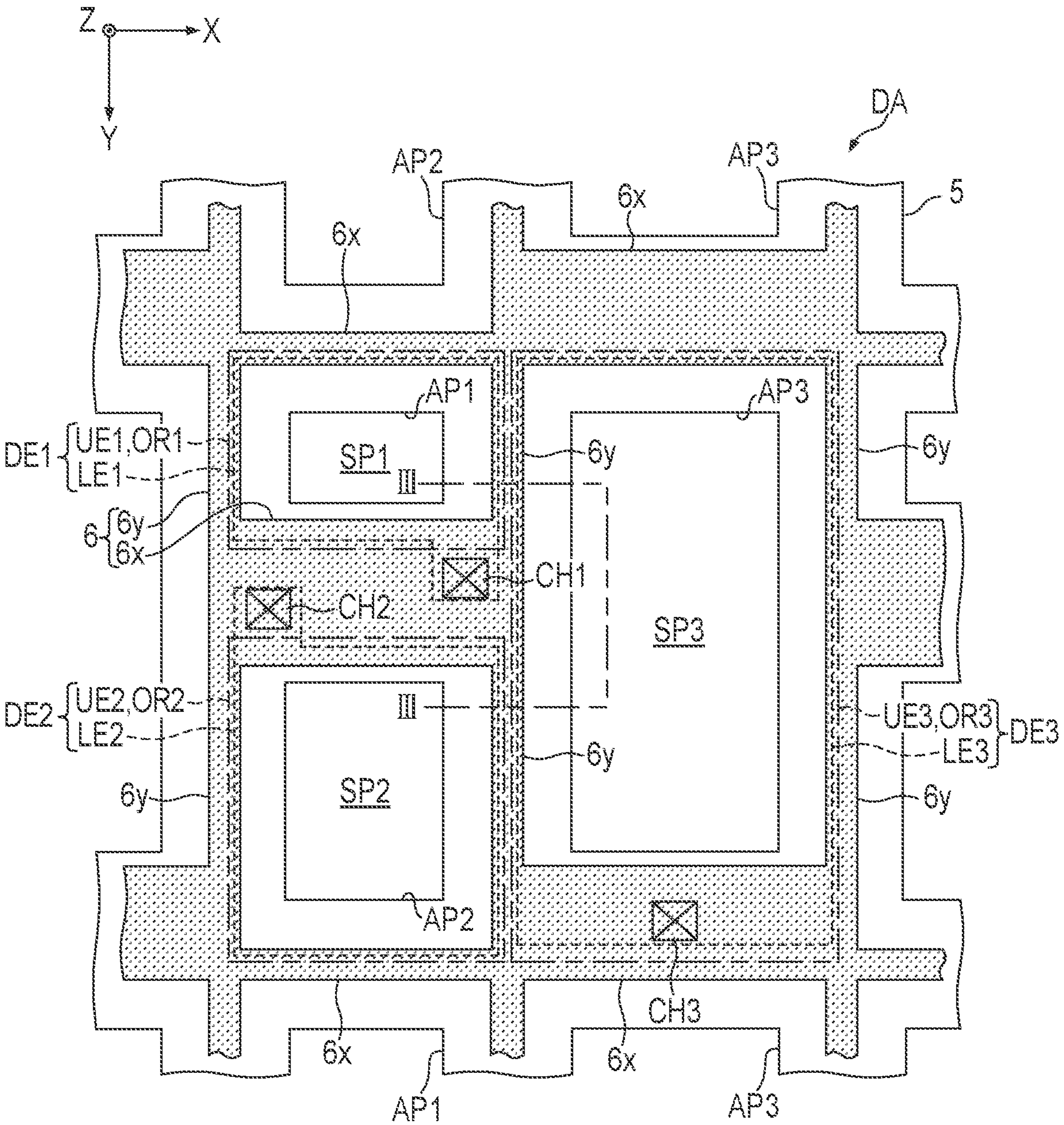
FIG. 2 is a diagram showing an example of the layout of subpixels according to the first embodiment.

FIG. 2 is a diagram showing an example of the layout of subpixels SP1, SP2 and SP3. In the example of FIG. 2, the first subpixel SP1 and the third subpixel SP3 are arranged in the first direction X. The second subpixel SP2 and the third subpixel SP3 are also arranged in the first direction X. Further, the first subpixel SP1 and the second subpixel SP2 are arranged in the second direction Y.

When subpixels SP1, SP2 and SP3 are provided in line with this layout, in the display area DA, a column in which subpixels SP1 and SP2 are alternately provided in the second direction Y and a column in which a plurality of third subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a first pixel aperture AP1 in the first subpixel SP1, comprises a second pixel aperture AP2 in the second subpixel SP2 and comprises a third pixel aperture AP3 in the third subpixel SP3. In the example of FIG. 2, the second pixel aperture AP2 is larger than the first pixel aperture AP1, and the third pixel aperture AP3 is larger than the second pixel aperture AP2.

The partition 6 is provided in each boundary between adjacent subpixels SP and overlaps the rib 5 as seen in plan view. The partition 6 comprises a plurality of first partitions 6*x* extending in the first direction X and a plurality of second partitions 6*y* extending in the second direction Y. The first partitions 6*x* are provided between the pixel apertures AP1 and AP2 which are adjacent to each other in the second direction Y and between two third pixel apertures AP3 which are adjacent to each other in the second direction Y. Each second partition 6*y* is provided between the pixel apertures AP1 and AP3 which are adjacent to each other in the first direction X and between the pixel apertures AP2 and AP3 which are adjacent to each other in the first direction X.

In the example of FIG. 2, the first partitions 6*x* and the second partitions 6*y* are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

The first subpixel SP1 comprises a first lower electrode LE1, a first upper electrode UE1 and a first organic layer OR1 overlapping the first pixel aperture AP1. The second subpixel SP2 comprises a second lower electrode LE2, a second upper electrode UE2 and a second organic layer OR2 overlapping the second pixel aperture AP2. The third subpixel SP3 comprises a third lower electrode LE3, a third upper electrode UE3 and a third organic layer OR3 overlapping the third pixel aperture AP3.

The first lower electrode LE1, the first upper electrode UE1 and the first organic layer OR1 constitute the first display element DE1 of the first subpixel SP1. The second lower electrode LE2, the second upper electrode UE2 and the second organic layer OR2 constitute the second display element DE2 of the second subpixel SP2. The third lower electrode LE3, the third upper electrode UE3 and the third organic layer OR3 constitute the third display element DE3 of the third subpixel SP3. Each of the display elements DE1, DE2 and DE3 may include a cap layer as described later.

For example, the first display element DE1 emits light in a red wavelength range. The second display element DE2 emits light in a green wavelength range. The third display element DE3 emits light in a blue wavelength range.

The first lower electrode LE1 is connected to the pixel circuit 1 (see FIG. 1) of the first subpixel SP1 through a first contact hole CH1. The second lower electrode LE2 is connected to the pixel circuit 1 of the second subpixel SP2 through a second contact hole CH2. The third lower electrode LE3 is connected to the pixel circuit 1 of the third subpixel SP3 through a third contact hole CH3.

In the example of FIG. 2, the contact holes CH1 and CH2 entirely overlap the first partition 6X between the pixel apertures AP1 and AP2 which are adjacent to each other in the second direction Y. The third contact hole CH3 entirely overlaps the first partition 6*x* between two third pixel apertures AP3 which are adjacent to each other in the second direction Y. As another example, at least part of the contact hole CH1, CH2 or CH3 may not overlap the first partition 6*x*.

Figure 3:
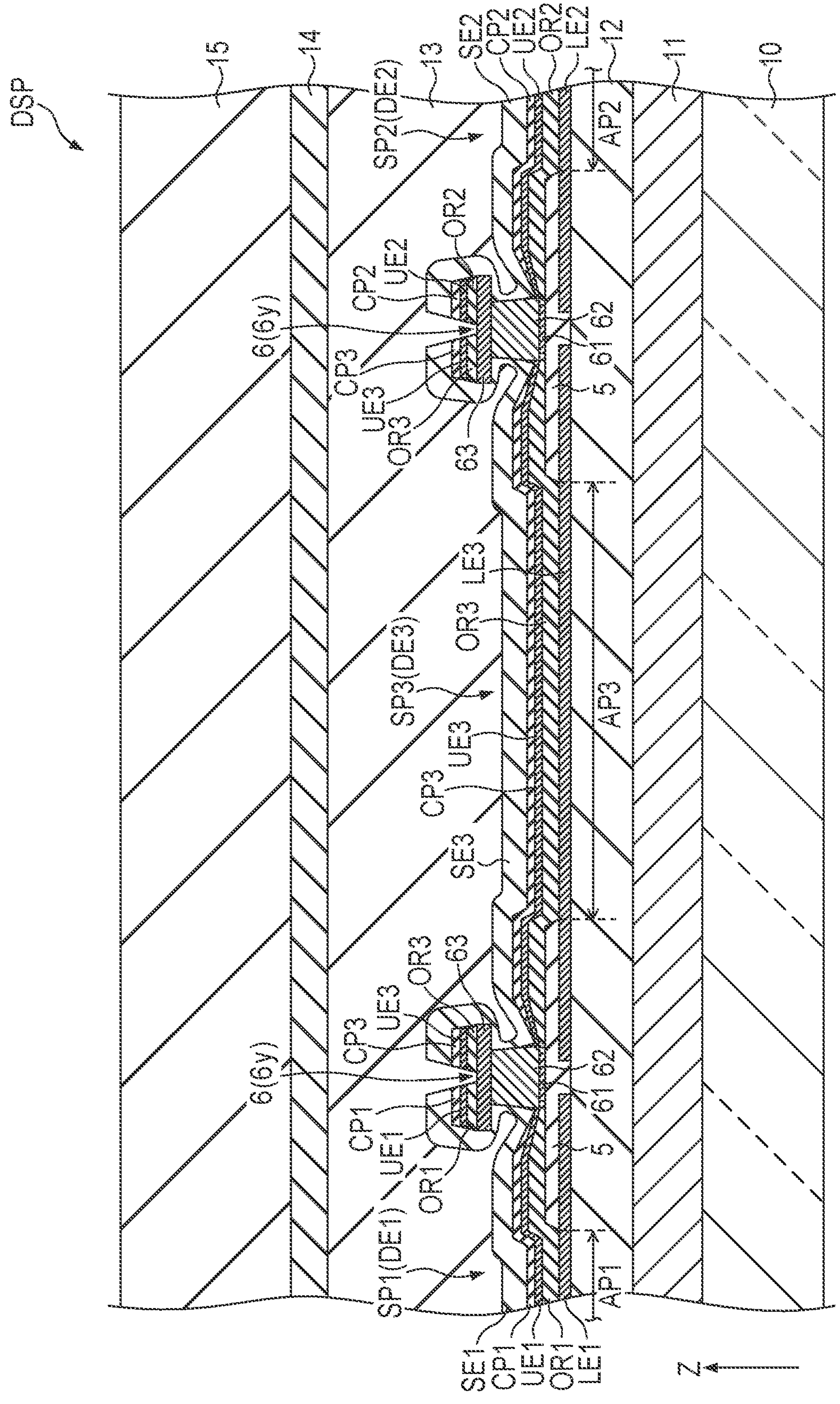
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a first portion 61 provided on the rib 5, a second portion 62 provided on the first portion 61 and a third portion 63 provided on the second portion 62.

The first organic layer OR1 covers the first lower electrode LE1 through the first pixel aperture AP1. The first upper electrode UE1 covers the first organic layer OR1 and faces the first lower electrode LE1. The second organic layer OR2 covers the second lower electrode LE2 through the second pixel aperture AP2. The second upper electrode UE2 covers the second organic layer OR2 and faces the second lower electrode LE2. The third organic layer OR3 covers the third lower electrode LE3 through the third pixel aperture AP3. The third upper electrode UE3 covers the third organic layer OR3 and faces the third lower electrode LE3.

In the example of FIG. 3, a first cap layer CP1 is provided on the first upper electrode UE1. A second cap layer CP2 is provided on the second upper electrode UE2. A third cap layer CP3 is provided on the third upper electrode UE3. The cap layers CP1, CP2 and CP3 adjust the optical property of the light emitted from the organic layers OR1, OR2 and OR3, respectively.

The first organic layer OR1, the first upper electrode UE1 and the first cap layer CP1 are partly located on the third portion 63. These portions are spaced apart from the other portions of the first organic layer OR1, the first upper electrode UE1 and the first cap layer CP1. Similarly, the second organic layer OR2, the second upper electrode UE2 and the second cap layer CP2 are partly located on the third portion 63, and these portions are spaced apart from the other portions of the second organic layer OR2, the second upper electrode UE2 and the second cap layer CP2. Further, the third organic layer OR3, the third upper electrode UE3 and the third cap layer CP3 are partly located on the third portion 63, and these portions are spaced apart from the other portions of the third organic layer OR3, the third upper electrode UE3 and the third cap layer CP3.

A first sealing layer SE1 is provided in the first subpixel SP1. A second sealing layer SE2 is provided in the second subpixel SP2. A third sealing layer SE3 is provided in the third subpixel SP3. The first sealing layer SE1 continuously covers the first cap layer CP1 and the partition 6 around the first subpixel SP1. The second sealing layer SE2 continuously covers the second cap layer CP2 and the partition 6 around the second subpixel SP2. The third sealing layer SE3 continuously covers the third cap layer CP3 and the partition 6 around the third subpixel SP3.

The sealing layers SE1, SE2 and SE3 are covered with a resin layer 13. The resin layer 13 is covered with a sealing layer 14. Further, the sealing layer 14 is covered with a resin layer 15.

The organic insulating layer 12 and the resin layers 13 and 15 are formed of an organic material. The rib 5 and the sealing layers 14, SE1, SE2 and SE3 are formed of, for example, an inorganic material such as silicon nitride (SiN), silicon oxide (SiO) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO). The upper electrodes UE1, UE2 and UE3 are formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

As explained in detail later, each of the organic layers OR1, OR2 and OR3 comprises a multilayer structure consisting of a hole injection layer, a hole transport layer, an electron blocking layer, a light emitting layer, a hole blocking layer, an electron transport layer, an electron injection layer, etc.

Each of the cap layers CP1, CP2 and CP3 is formed by, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partitions 6. This common voltage is applied to each of the upper electrodes UE1, UE2 and UE3 which are in contact with the side surfaces of the second portions 62. Pixel voltage is applied to the lower electrodes LE1, LE2 and LE3 through the pixel circuits 1 provided in subpixels SP1, SP2 and SP3, respectively.

When a potential difference is formed between the first lower electrode LE1 and the first upper electrode UE1, the light emitting layer of the first organic layer OR1 emits light in a red wavelength range. When a potential difference is formed between the second lower electrode LE2 and the second upper electrode UE2, the light emitting layer of the second organic layer OR2 emits light in a green wavelength range. When a potential difference is formed between the third lower electrode LE3 and the third upper electrode UE3, the light emitting layer of the third organic layer OR3 emits light in a blue wavelength range.

Figure 4:
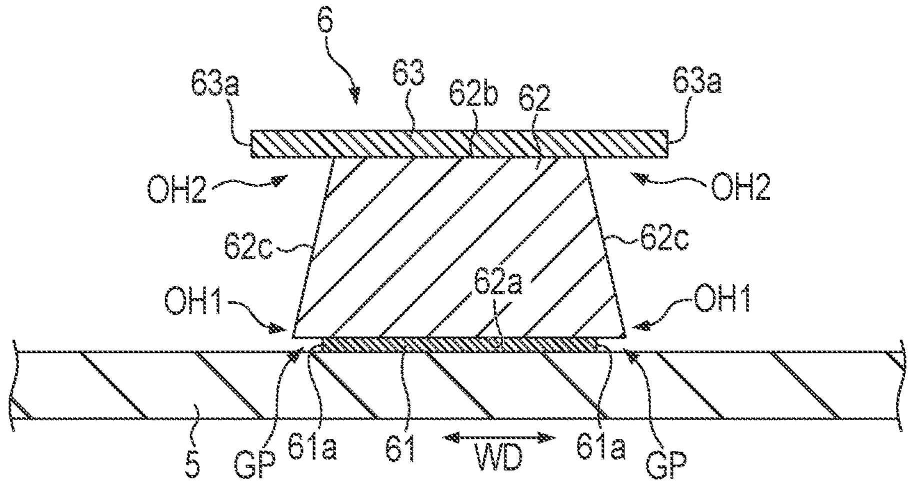
FIG. 4 is a schematic cross-sectional view of a partition according to the first embodiment.

FIG. 4 is a schematic cross-sectional view of the partition 6 according to the present embodiment. In this figure, the partition 6 and the rib 5 are shown, and the other elements are omitted. In the figure, a width direction WD is a direction orthogonal to the extension direction of the partition 6 and a third direction Z. For example, the width direction WD of each first partition 6*x* shown in FIG. 2 corresponds to the second direction Y, and the width direction WD of each second partition 6*y* corresponds to the first direction X. Both the first partitions 6*x* and the second partitions 6*y* comprise the cross-sectional structure shown in FIG. 4.

The first portion 61 comprises a pair of end portions 61*a* in the width direction WD. The second portion 62 comprises a lower end 62*a* (lower surface) which is in contact with the first portion 61, an upper end 62*b* (upper surface) which is in contact with the third portion 63, and a pair of side surfaces 62*c* in the width direction WD. The third portion 63 comprises a pair of end portions 63*a* in the width direction WD.

In the example of FIG. 4, the second portion 62 is shaped so as to be tapered from the lower end 62*a* toward the upper end 62*b*. By this structure, the side surfaces 62*c* incline with respect to the third direction Z. As another example, the side surfaces 62*c* may be substantially parallel to the third direction Z.

The width of the lower end 62*a* is greater than that of the first portion 61. By this structure, the lower end 62*a* protrudes to the both sides in the width direction WD relative to the first portion 61. The width of the upper portion 62*b* is less than that of the third portion 63. By this structure, the third portion 63 protrudes to the both sides in the width direction WD relative to the upper end 62*b*.

Thus, in the present embodiment, a pair of first overhang structures OH1 is formed by the lower end 62*a*, and a pair of second overhang structures OH2 is formed by the third portion 63. Near each side surface 62*c*, a gap GP is defined between the lower end 62*a* and the rib 5.

Figure 5:
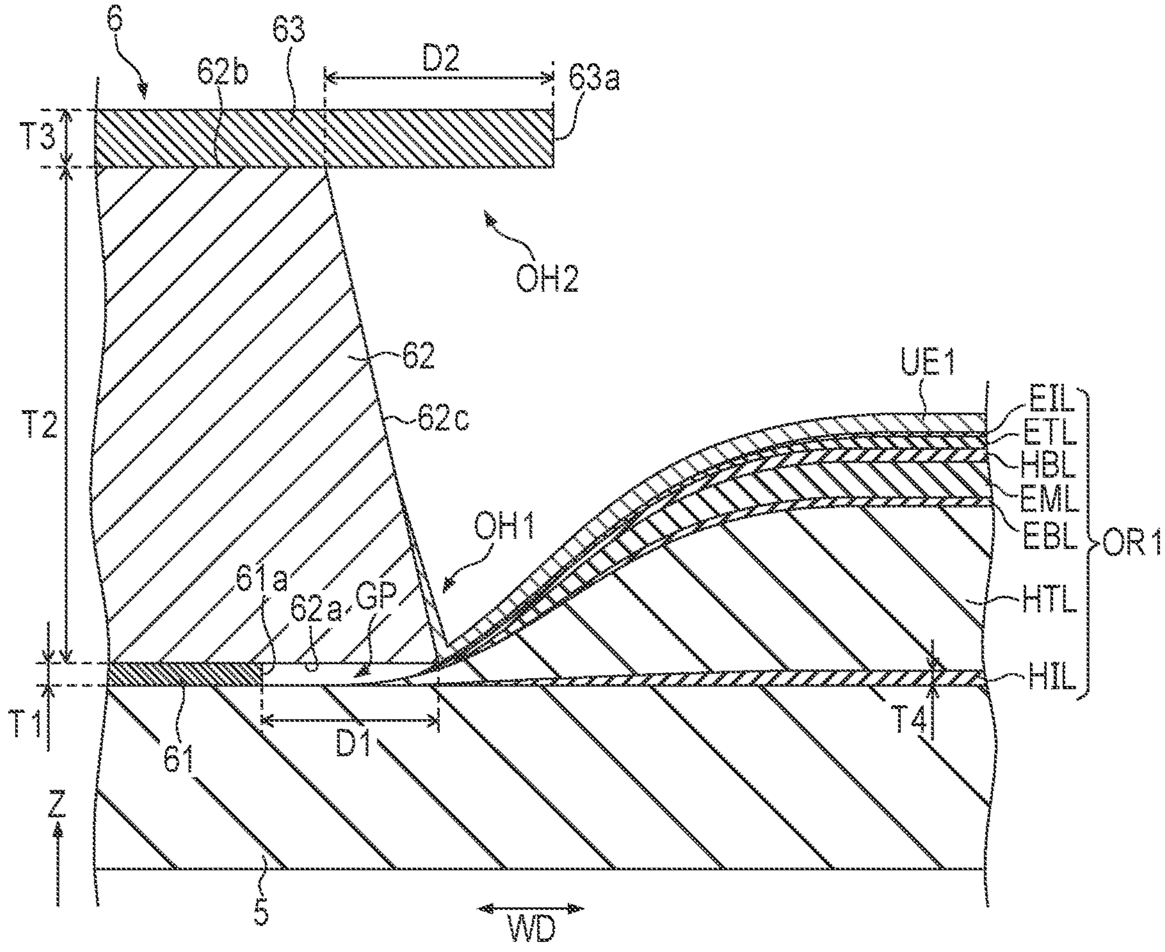
FIG. 5 is a schematic cross-sectional view of a rib, the partition, an organic layer and an upper electrode according to the first embodiment.

FIG. 5 is a schematic cross-sectional view of the rib 5, the partition 6, the first organic layer OR1 and the first upper electrode UE1. Although omitted in FIG. 5, the first organic layer OR1 and the first upper electrode UE1 are partly provided on the third portion 63 (see FIG. 3).

In the example of FIG. 5, the first organic layer OR1 comprises a hole injection layer HIL, a hole transport layer HTL, an electron blocking layer EBL, a light emitting layer EML, a hole blocking layer HBL, an electron transport layer ETL and an electron injection layer EIL stacked in order in the third direction Z. Of these layers, the hole transport layer HTL is the thickest. The thickness of the hole transport layer HTL is, for example, half the thickness of the entire first organic layer OR1 or greater.

The hole injection layer HIL covers the rib 5 and covers the first lower electrode LE1 through the first pixel aperture AP1 shown in FIG. 2 and FIG. 3. The thicknesses of the hole injection layer HIL, the hole transport layer HTL, the electron blocking layer EBL, the light emitting layer EML, the hole blocking layer HBL, the electron transport layer ETL and the electron injection layer EIL near the partition 6 decrease toward the side surface 62*c*.

The hole injection layer HIL is not in contact with the partition 6. Specifically, the hole injection layer HIL is spaced apart from the first portion 61, and the lower end 62*a* and the side surface 62*c* of the second portion 62. It should be noted that, near the lower end 62*a*, a thin film formed of the same material as the hole injection layer HIL may be attached to the side surface 62*c*, and this thin film may be spaced apart from the hole injection layer HIL.

In the example of FIG. 5, the hole injection layer HIL and the hole transport layer HTL partially go into the gap GP. Further, the entrance of the gap GP (immediately under the corner portion formed by the lower end 62*a* and the side surface 62*c*) is blocked by, of the layers of the first organic layer OR1, the layers (the hole transport layer HTL, etc.,) provided on the hole injection layer HIL. The first upper electrode UE1 continuously covers the first organic layer OR1 and part of the side surface 62*c*.

The first portion 61, the second portion 62 and the third portion 63 are conductive. The third portion 63 may be insulated. In the present embodiment, the first portion 61 is formed of molybdenum (Mo). The second portion 62 is formed of aluminum (Al). The third portion 63 is formed of titanium (Ti).

The thickness T1 of the first portion 61 is sufficiently less than the thickness T2 of the second portion 62 (T1<T2). The thickness T3 of the third portion 63 is greater than thickness T1 but less than thickness T2 (T1<T3<T2). For example, thickness T1 is 20 nm. Thickness T2 is 500 nm. Thickness T3 is 100 nm. Thickness T1 corresponds to the height of the gap GP.

Thickness T1 is greater than the thickness T4 of the hole injection layer HIL (T4<T1). Thickness T4 is the thickness of the hole injection layer HIL excluding the thin portion near the partition 6. In other words, thickness T4 is the thickness of, of the hole injection layer HIL, the portion which covers the first lower electrode LE1.

In the example of FIG. 5, the length D1 in which the lower end 62*a* of the second portion 62 protrudes from the end portion 61*a* of the first portion 61 is less than the length D2 in which the third portion 63 protrudes from the upper end 62*b* of the second portion 62 (D1<D2). However, the configuration is not limited to this example. Length D1 may be greater than or equal to length D2. Length D1 should be preferably twice thickness T1 or greater (2×T1<D1).

The organic layers OR2 and OR3 and the upper electrodes UE2 and UE3 comprise the same structure as the first organic layer OR1 and the first upper electrode UE1 shown in FIG. 5. It should be noted that the thicknesses of the layers included in the organic layers OR1, OR2 and OR3 may differ depending on the organic layer.

Now, this specification explains a manufacturing method of the display device DSP.

FIG. 6A to FIG. 6D are schematic cross-sectional views mainly showing a process for forming the partition 6 in the manufacturing method of the display device DSP. First, the circuit layer 11, the organic insulating layer 12, the lower electrodes LE1, LE2 and LE3 and the rib 5 are formed in order above the substrate 10.

Figure 6A:
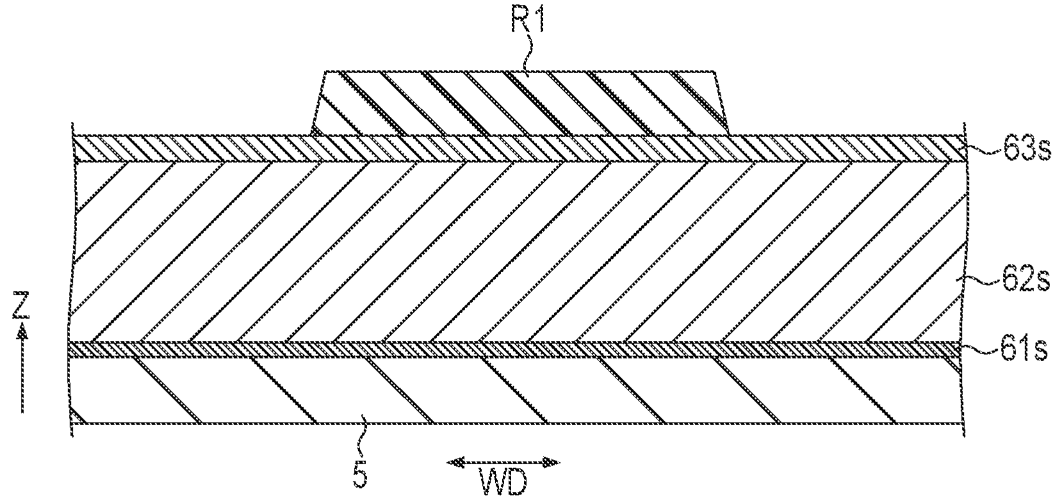
FIG. 6A is a diagram showing the process of forming the partition according to the first embodiment.

Subsequently, as shown in FIG. 6A, a first layer 61*s* which is the base of the first portion 61, a second layer 62*s* which is the base of the second portion 62 and a third layer 63*s* which is the base of the third portion 63 are formed in order above the rib 5. The first layer 61*s*, the second layer 62*s* and the third layer 63*s* are formed in at least the entire display area DA. Further, a resist R1 is formed on the third layer 63*s*. The resist R1 has been patterned into the shape of the partition 6 as seen in plan view.

Figure 6B:
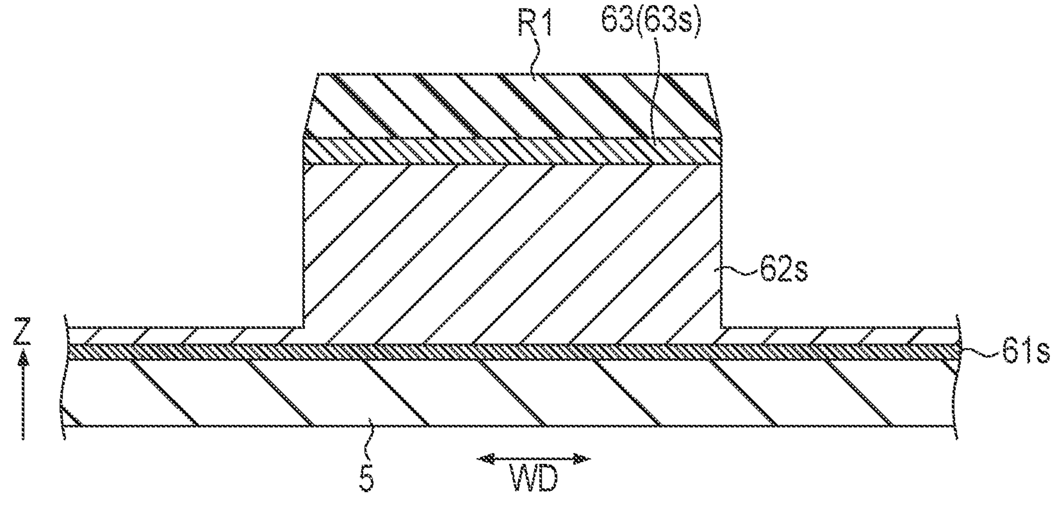
FIG. 6B is a diagram showing a process following FIG. 6A.

Subsequently, anisotropic dry etching employing, for example, a chlorine-based etching gas, is applied using the resist R1 as a mask. As shown in FIG. 6B, of the third layer 63*s*, the portion exposed from the resist R1 is removed. In this way, the third portion 63 having the shape shown in FIG. 4 is formed. In this dry etching, of the second layer 62*s*, the thickness of the portion exposed from the resist R1 is also reduced.

Figure 6C:
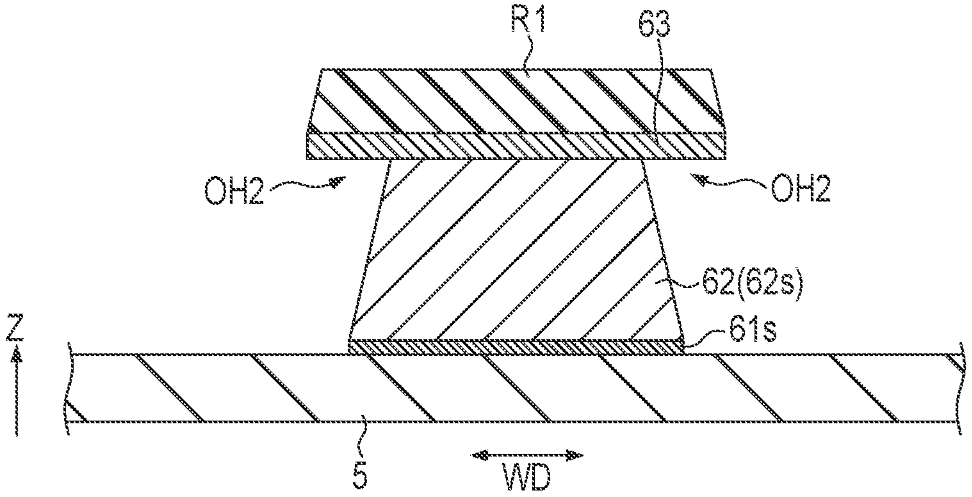
FIG. 6C is a diagram showing a process following FIG. 6B.

Subsequently, isotropic wet etching is applied. As shown in FIG. 6C, of the second layer 62*s*, the entire portion exposed from the resist R1 is removed. In this wet etching, the side surfaces of the second layer 62*s* also corrode, and the width of the second layer 62*s* is reduced. In this way, the second portion 62 and the second overhang structures OH2 having the shapes shown in FIG. 4 are formed. Further, in the wet etching, of the first layer 61*s*, the portion exposed from the second portion 62 is also removed.

Figure 6D:
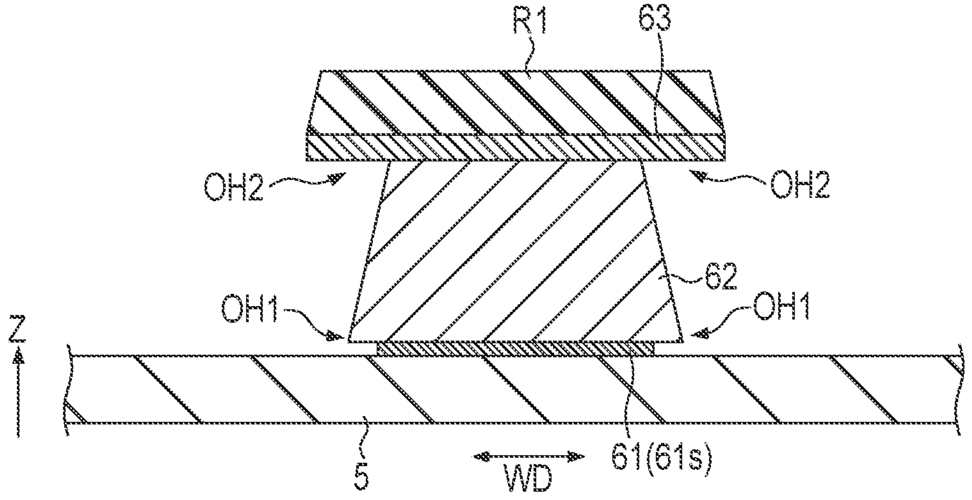
FIG. 6D is a diagram showing a process following FIG. 6C.

Subsequently, isotropic wet etching is applied again. For this wet etching, an etchant which corrodes the first layer 61*s* and does not easily corrode the second portion 62 is used. By this process, as shown in FIG. 6D, the width of the first layer 61*s* is reduced, and the first portion 61 and the first overhang structures OH1 having the shapes shown in FIG. 4 are formed. It should be noted that the first layer 61*s* may be processed by dry etching when the rib 5 is resistant to dry etching such as a case where the rib 5 is formed of silicon oxynitride.

After the first portion 61, the second portion 62 and the third portion 63 are formed in the above manner, the resist R1 is removed. By this process, the partition 6 is completed. Subsequently, a process for forming the display elements DE1, DE2 and DE3 is applied to subpixels SP1, SP2 and SP3.

Figure 7A:
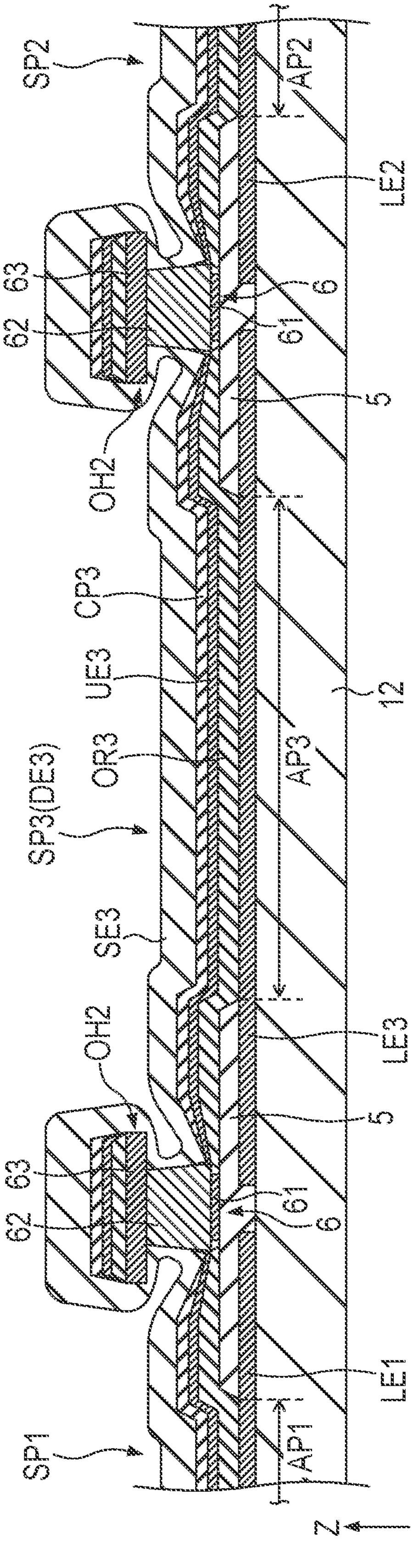
FIG. 7A is a diagram showing the process of forming a display element according to the first embodiment.
Figure 7B:
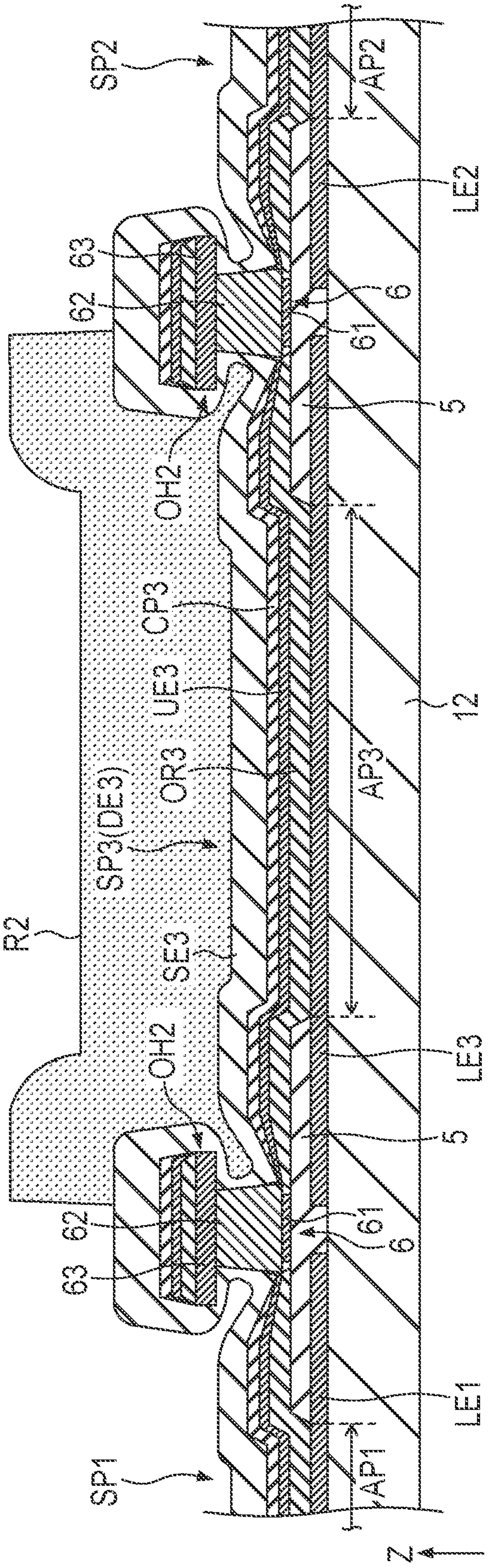
FIG. 7B is a diagram showing a process following FIG. 7A.
Figure 7C:
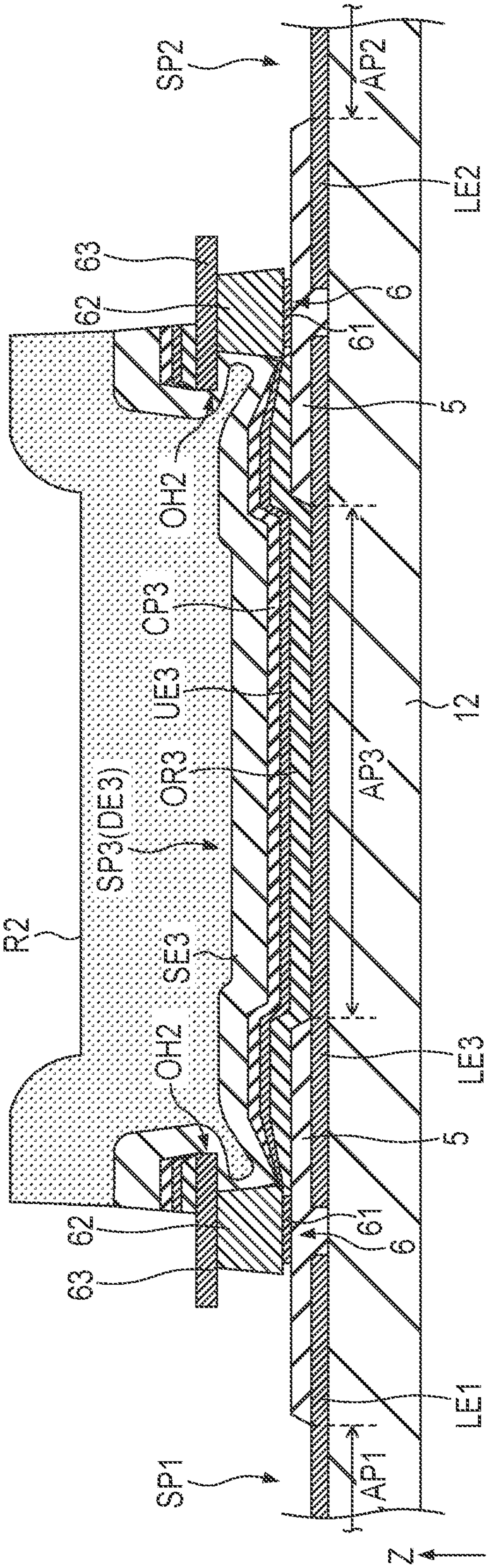
FIG. 7C is a diagram showing a process following FIG. 7B.

FIG. 7A to FIG. 7C are schematic cross-sectional views mainly showing a process for forming the display elements DE1, DE2 and DE3 in the manufacturing method of the display device DSP. Here, for example, this specification assumes a case where the third display element DE3 is formed firstly, and the second display element DE2 is formed secondly, and the first display element DE1 is formed lastly. It should be noted that the formation order of the display elements DE1, DE2 and DE3 is not limited to this example.

First, the third organic layer OR3, the third upper electrode UE3, the third cap layer CP3 and the third sealing layer SE3 are formed in order by vapor deposition for the entire substrate as shown in FIG. 7A. At this time, the third organic layer OR3, the third upper electrode UE3 and the third cap layer CP3 formed in subpixels SP1, SP2 and SP3 are divided by the second overhang structures OH2 of the partitions 6. The third sealing layer SE3 continuously covers the third cap layer CP3 and the partitions 6.

The process of forming the third organic layer OR3 includes the process of forming the hole injection layer HIL, the hole transport layer HTL, the electron blocking layer EBL, the light emitting layer EML, the hole blocking layer HBL, the electron transport layer ETL and the electron injection layer EIL in order by vapor deposition. Of these layers constituting the third organic layer OR3, the layers which are formed after the hole injection layer HIL, such as the hole transport layer HTL, block the entrance of the gap GP shown in FIG. 5.

Subsequently, as shown in FIG. 7B, a resist R2 is formed on the third sealing layer SE3. The resist R2 has been patterned so as to overlap the third subpixel SP3. The resist R2 is also located immediately above, of the third organic layer OR3, the third upper electrode UE3 and the third cap layer CP3 located on the partition 6 surrounding the third subpixel SP3, a portion which is close to the third subpixel SP3.

Further, of the third organic layer OR3, the third upper electrode UE3, the third cap layer CP3 and the third sealing layer SE3, the portions exposed from the resist R2 are removed as shown in FIG. 7C by etching using the resist R2 as a mask. This process enables the acquisition of a substrate in which the third display element DE3 including the third lower electrode LE3, the third organic layer OR3, the third upper electrode UE3 and the third cap layer CP3 is formed in the third subpixel SP3, and no display element is formed in subpixel SP1 or SP2.

Subsequently, the resist R2 is removed, and a process for forming the second display element DE2 in the second subpixel SP2 and a process for forming the first display element DE1 in the first subpixel SP1 are performed in series. These processes are similar to the process of forming the third display element DE3.

After the formation of the display elements DE1, DE2 and DE3, the process of forming the resin layer 13, the sealing layer 14 and the resin layer 15 is performed. In this way, the display device DSP comprising the structure shown in FIG. 3 is completed.

In the present embodiment described above, as shown in FIG. 4, the partition 6 comprising the first portion 61, the second portion 62 and the third portion 63 is provided in each boundary of subpixels SP1, SP2 and SP3. Thus, various preferred effects which improve the reliability of the display device DSP can be obtained.

For example, the second overhang structures OH2 in which the third portion 63 protrudes relative to the upper end 62*b* of the second portion 62 divide the peripheral portions of the organic layers OR1, OR2 and OR3, the upper electrodes UE1, UE2 and UE3 and the cap layers CP1, CP2 and CP3. By this structure, when the display elements DE1, DE2 and DE3 are formed by the method shown in FIG. 7A to FIG. 7C, the display elements DE1, DE2 and DE3 can be satisfactorily sealed by the sealing layers SE1, SE2 and SE3. As a result, this structure prevents the impregnation and diffusion of moisture in the display elements DE1, DE2 and DE3.

If the hole injection layer HIL of the organic layer OR1, OR2 or OR3 is in contact with the partition 6, leak current flows from the lower electrode LE1, LE2 or LE3 to the partition 6 via the hole injection layer HIL without passing through layers such as the light emitting layer EML. Thus, display failure may occur. In the present embodiment, the partition 6 comprises the first overhang structures OH1 in which the lower end 62*a* of the second portion 62 protrudes relative to the first portion 61. Thus, of the partition 6, the lower portion which is easily attached to the hole injection layer HIL retreats in the width direction WD. Therefore, the hole injection layer HIL does not easily come in contact with the partition 6 when the hole injection layer HIL is deposited. Even if the material of the hole injection layer HIL comes in contact with the side surface 62*c* of the second portion 62, this portion is divided from the display element DE1, DE2 or DE3 by the first overhang structure OH1. By these factors, the contact between the hole injection layer HIL and the partition 6 is prevented. As a result, it is possible to prevent a display failure caused by leak current.

As described above, when the thickness T1 of the first portion 61 is greater than the thickness T4 of the hole injection layer HIL, the contact between the hole injection layer HIL and the second portion 62 can be further assuredly prevented. In a case where the length D1 in which the second portion 62 protrudes from the first portion 61 is twice the thickness of the first portion 61 or greater, even if the hole injection layer HIL goes into the gap GP, the contact between the hole injection layer HIL and the first portion 61 can be prevented.

As shown in FIG. 5, when the entrance of the gap GP is blocked by the hole transport layer HTL, etc., the division of the upper electrode UE1, UE2 or UE3 by the first overhang structure OH1 can be prevented. By this configuration, electricity can be satisfactorily supplied from the partitions 6 to the upper electrodes UE1, UE2 and UE3.

Even when the partition 6 does not comprise the first overhang structures OH1, the contact between the hole injection layer HIL and the partition 6 could be prevented by appropriately adjusting the thickness T2 of the second portion 62 and the protrusion length D2 of the third portion 63. However, in this case, thickness T2 and length D2 need to be controlled in detail when the display device DSP is manufactured.

In the configuration of the partition 6 of the present embodiment, the function of preventing the contact between the hole injection layer HIL and the partition 6 can be entrusted to the first overhang structure OH1. Thus, the tolerance of dimensions such as thickness T2 and length D2 is increased. Further, the restriction of the variation in the shape of the partition 6 at the time of manufacturing can be eased.

The configuration of the partition 6 comprising the first overhang structures OH1 and the second overhang structures OH2 or the process of forming such a partition 6 is not limited to the configuration or process disclosed in the present embodiment. In the second to twelfth embodiments explained below, other examples of the configuration of the partition 6 and the process of forming the partition 6 are disclosed. With regard to configurations which are not particularly referred to in these embodiments, configurations similar to those of the first embodiment can be applied.

Second Embodiment

Figure 8:
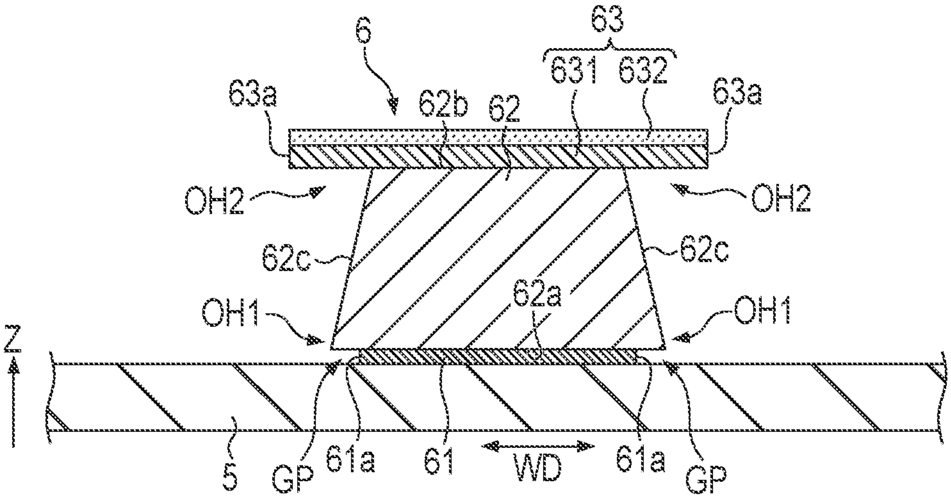
FIG. 8 is a schematic cross-sectional view of a partition according to a second embodiment.

FIG. 8 is a schematic cross-sectional view of a partition 6 according to the second embodiment. The partition 6 of the present embodiment comprises a first portion 61, a second portion 62 and a third portion 63 in a manner similar to that of the first embodiment. However, in the present embodiment, the third portion 63 includes a titanium layer 631 formed of titanium, and a conductive oxide layer 632 formed of conductive oxide such as ITO, IZO and IGZO. In a manner similar to that of the first embodiment, the first portion 61 is formed of molybdenum, and the second portion 62 is formed of aluminum, and a rib 5 is formed of silicon nitride or silicon oxynitride.

The titanium layer 631 is provided on the upper end 62*b* of the second portion 62. The conductive oxide layer 632 is provided on the titanium layer 631. The conductive oxide layer 632 is formed so as to be thinner than the titanium layer 631.

For example, the thickness of the first portion 61 is 20 nm. The thickness of the second portion 62 is 500 nm. The thickness of the titanium layer 631 is 100 nm. The thickness of the conductive oxide layer 632 is 50 nm.

Figure 9A:
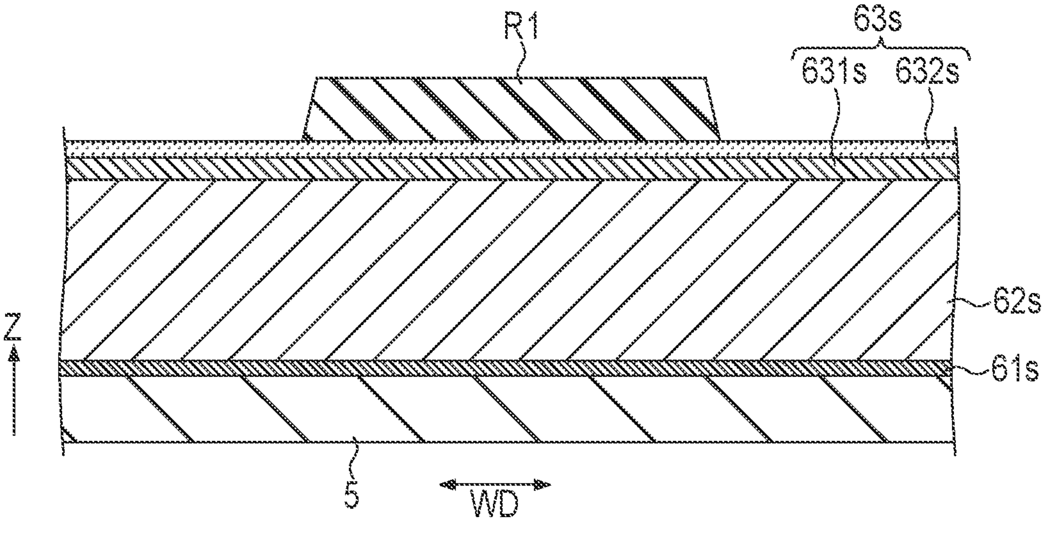
FIG. 9A is a diagram showing the process of forming the partition according to the second embodiment.

FIG. 9A to FIG. 9E are diagrams showing an example of the process of forming the partition 6 according to the present embodiment. First, as shown in FIG. 9A, a first layer 61*s* which is the base of the first portion 61, a second layer 62*s* which is the base of the second portion 62, a third layer 63*s* which is the base of the third portion 63 and a resist R1 are formed in order above the rib 5. The third layer 63*s* includes a titanium layer 631*s* and a conductive oxide layer 632*s*.

Figure 9B:
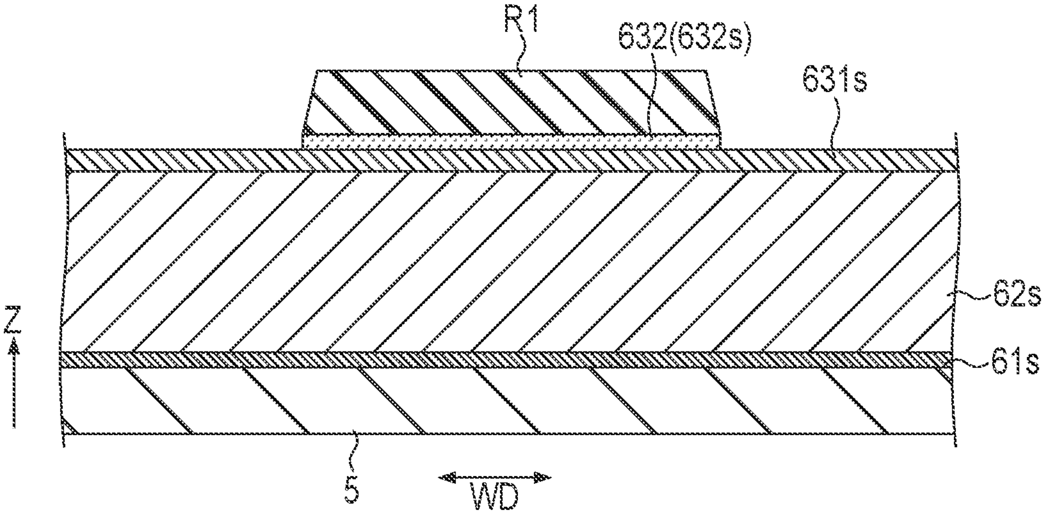
FIG. 9B is a diagram showing a process following FIG. 9A.

Subsequently, wet etching is applied using the resist R1 as a mask. As shown in FIG. 9B, of the conductive oxide layer 632*s*, the portion exposed from the resist R1 is removed. By this process, the conductive oxide layer 632 having the shape shown in FIG. 8 is formed.

Figure 9C:
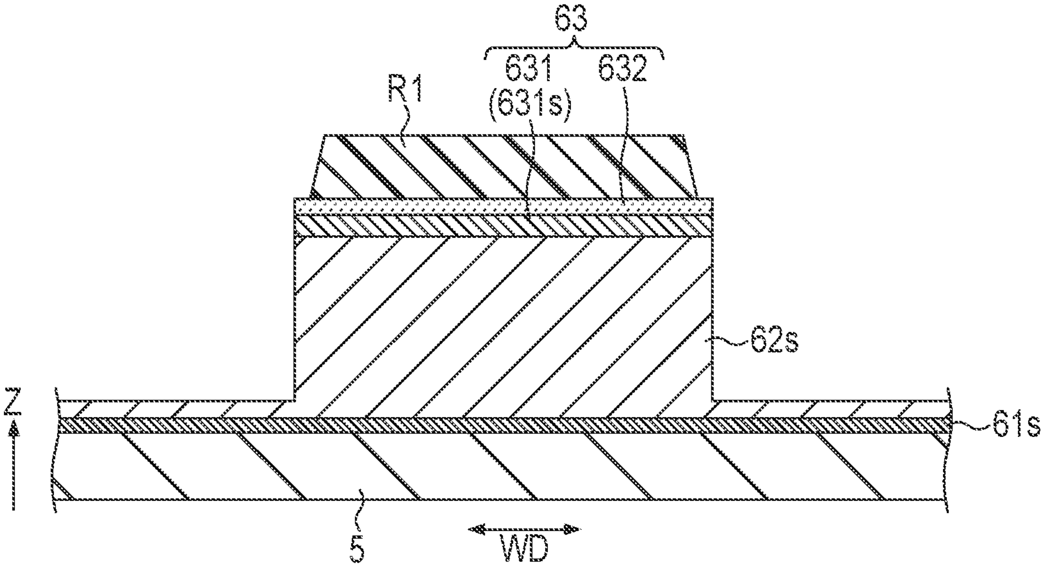
FIG. 9C is a diagram showing a process following FIG. 9B.

Further, anisotropic dry etching employing, for example, a chlorine-based etching gas, is applied using the resist R1 as a mask. As shown in FIG. 9C, of the titanium layer 631*s*, the portion exposed from the resist R1 is removed. By this process, the titanium layer 631 having the shape shown in FIG. 8 is formed. In this dry etching, of the second layer 62*s*, the thickness of the portion exposed from the resist R1 is also reduced. In the example of FIG. 9C, in the dry etching, the width of the resist R1 is slightly reduced.

Figure 9D:
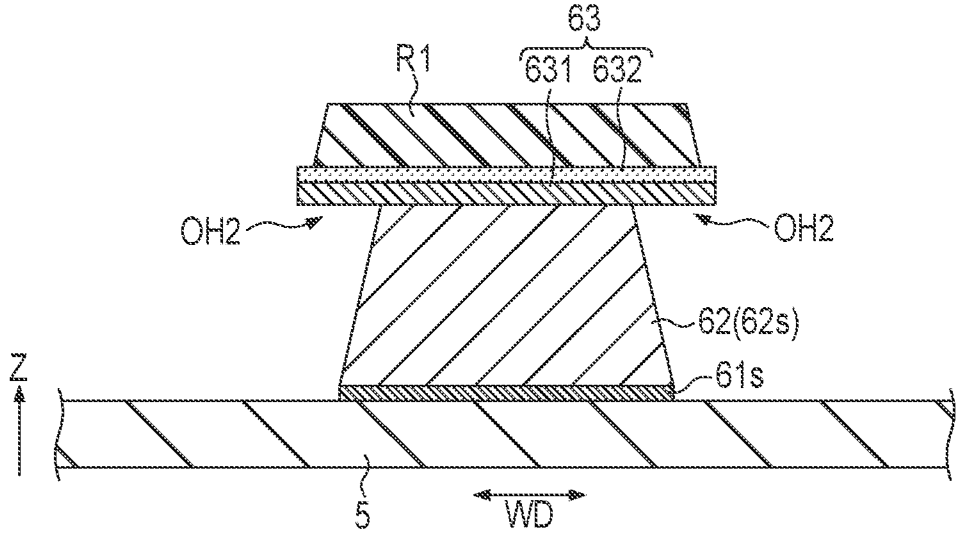
FIG. 9D is a diagram showing a process following FIG. 9C.

Subsequently, isotropic wet etching is applied. As shown in FIG. 9D, of the second layer 62*s*, the entire portion exposed from the resist R1 is removed. In this wet etching, the side surfaces of the second layer 62*s* also corrode, and the width of the second layer 62*s* is reduced. By this process, the second portion 62 and second overhang structures OH2 having the shapes shown in FIG. 8 are formed. Further, in the wet etching, of the first layer 61*s*, the portion exposed from the second portion 62 is also removed.

Figure 9E:
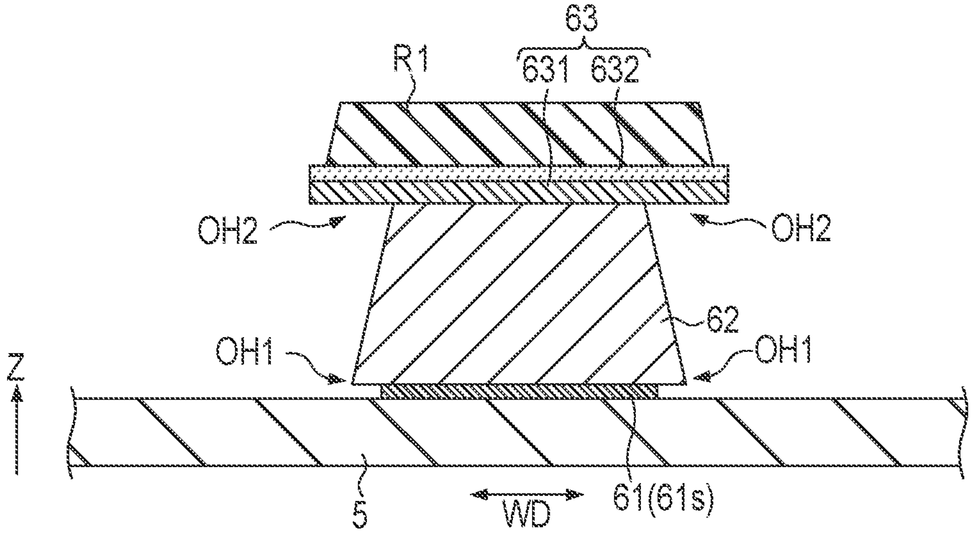
FIG. 9E is a diagram showing a process following FIG. 9D.

Subsequently, wet etching is applied again. For this wet etching, an etchant which corrodes the first layer 61*s* and does not easily corrode the second portion 62 is used. By this process, as shown in FIG. 9E, the width of the first layer 61*s* is reduced, and the first portion 61 and first overhang structures OH1 having the shapes shown in FIG. 8 are formed. After the first portion 61, the second portion 62 and the third portion 63 are formed in the above manner, the resist R1 is removed. By this process, the partition 6 is completed.

In the configuration of the partition 6 of the present embodiment, the second overhang structures OH2 having a stable shape can be formed. In other words, even if the width of the resist R1 is reduced as shown in FIG. 9C when the titanium layer 631*s* and the second layer 62*s* are etched, the conductive oxide layer 632 functions as a mask. By this configuration, the titanium layer 631 and the second portion 62 can be accurately formed. As a result, the shape of the second overhang structures OH2 is stabilized.

Third Embodiment

Figure 10:
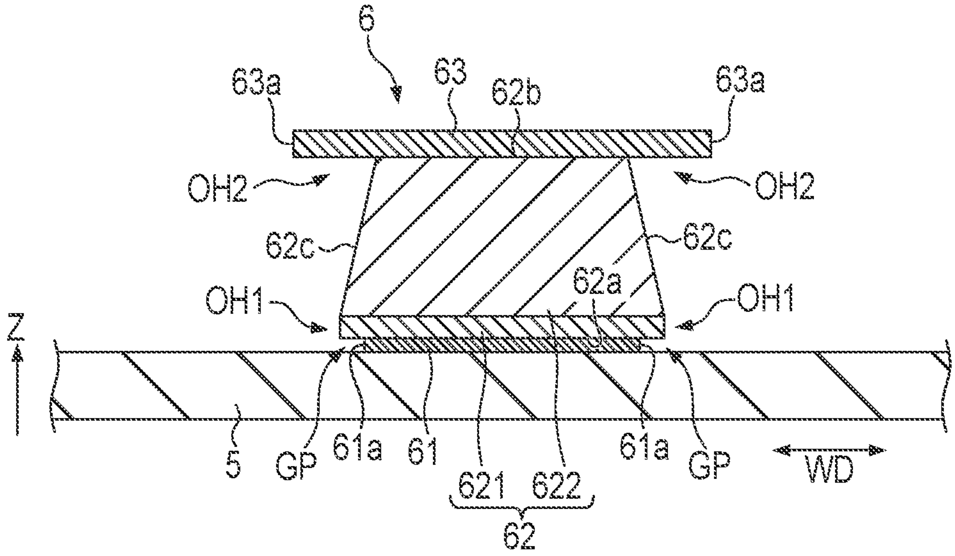
FIG. 10 is a schematic cross-sectional view of a partition according to a third embodiment.

FIG. 10 is a schematic cross-sectional view of a partition 6 according to the third embodiment. The partition 6 of the present embodiment comprises a first portion 61, a second portion 62 and a third portion 63 in a manner similar to that of the first embodiment. However, in the present embodiment, the second portion 62 includes an aluminum alloy layer 621 formed of an aluminum alloy, and an aluminum layer 622 formed of aluminum (pure aluminum). For the material of the aluminum alloy layer 621, for example, an aluminum-neodymium alloy (AlNd) or an aluminum-silicon alloy (AlSi) can be used. In a manner similar to that of the first embodiment, the first portion 61 is formed of molybdenum, and the third portion 63 is formed of titanium, and a rib 5 is formed of silicon nitride or silicon oxynitride.

The aluminum alloy layer 621 is provided on the first portion 61. The aluminum layer 622 is provided on the aluminum alloy layer 621. The aluminum alloy layer 621 is formed so as to be thinner than the aluminum layer 622.

For example, the thickness of the first portion 61 is 20 nm. The thickness of the aluminum alloy layer 621 is 50 nm. The thickness of the aluminum layer 622 is 450 nm. The thickness of the third portion 63 is 100 nm.

Figure 11A:
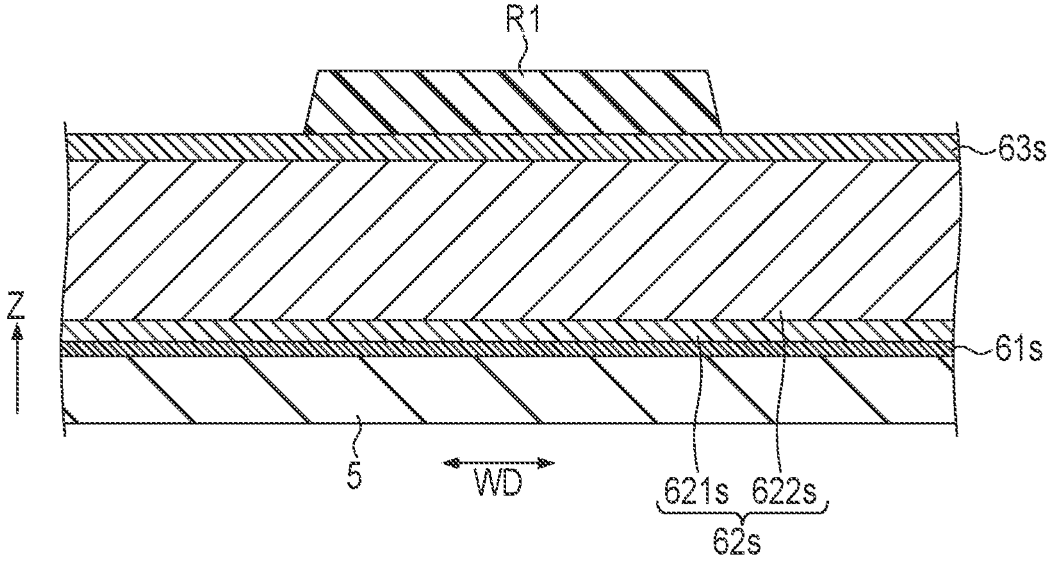
FIG. 11A is a diagram showing the process of forming the partition according to the third embodiment.

FIG. 11A to FIG. 11D are diagrams showing an example of the process of forming the partition 6 according to the present embodiment. First, as shown in FIG. 11A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum alloy layer 621*s* and an aluminum layer 622*s*.

Figure 11B:
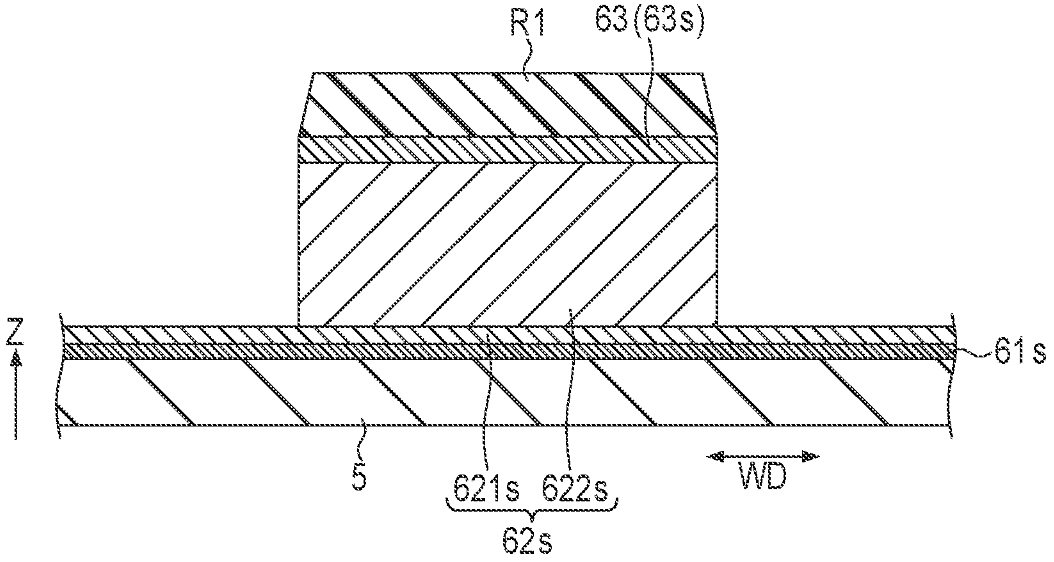
FIG. 11B is a diagram showing a process following FIG. 11A.

Subsequently, anisotropic dry etching employing, for example, a chlorine-based etching gas, is applied using the resist R1 as a mask. As shown in FIG. 11B, of the third layer 63*s*, the portion exposed from the resist R1 is removed. By this process, the third portion 63 having the shape shown in FIG. 10 is formed. In this dry etching, of the aluminum layer 622*s*, the portion exposed from the resist R1 is also removed. The aluminum alloy layer 621*s* functions as an etching stopper of the dry etching.

Figure 11C:
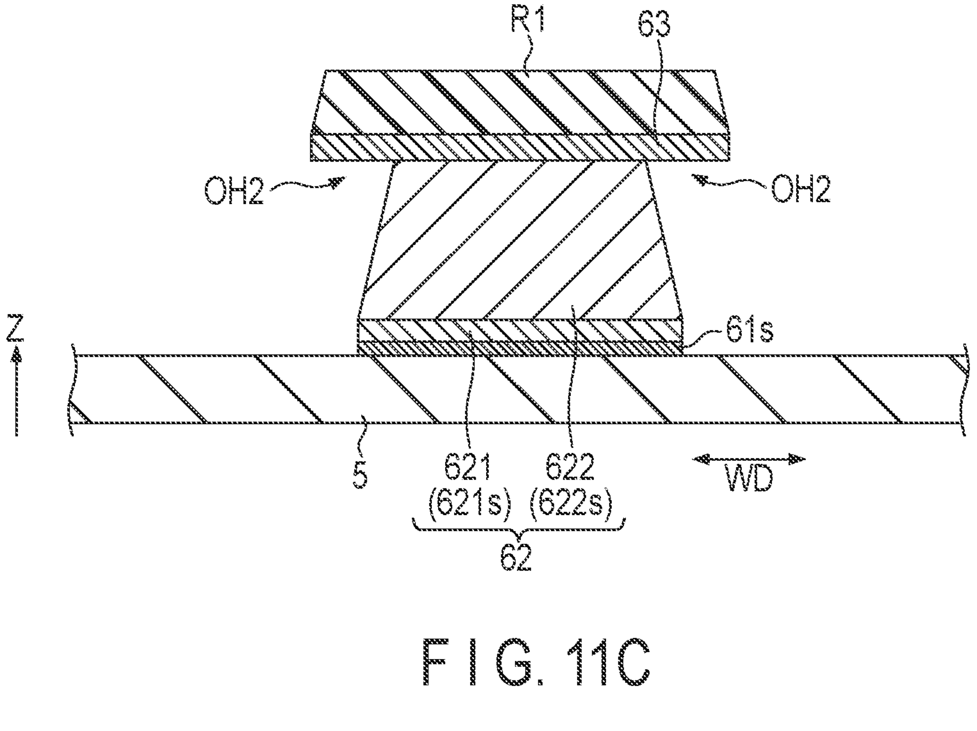
FIG. 11C is a diagram showing a process following FIG. 11B.

Subsequently, isotropic wet etching is applied. As shown in FIG. 11C, of the aluminum alloy layer 621*s*, the portion exposed from the resist R1 is removed. In this wet etching, the side surfaces of the aluminum alloy layer 621*s* and the aluminum layer 622*s* also corrode, and the widths of these layers are reduced. By this process, the second portion 62 including the aluminum alloy layer 621 and the aluminum layer 622 and second overhang structures OH2 having the shapes shown in FIG. 10 are formed. Further, in the wet etching, of the first layer 61*s*, the portion exposed from the second portion 62 is also removed.

Figure 11D:
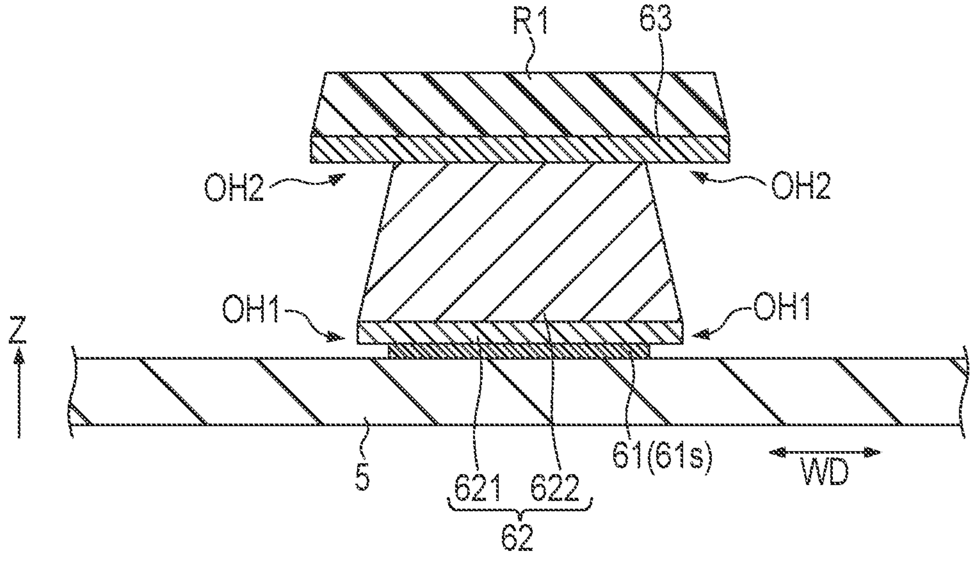
FIG. 11D is a diagram showing a process following FIG. 11C.

Subsequently, wet etching is applied again. For this wet etching, an etchant which corrodes the first layer 61*s* and does not easily corrode the second portion 62 is used. By this process, as shown in FIG. 11D, the width of the first layer 61*s* is reduced, and the first portion 61 and first overhang structures OH1 having the shapes shown in FIG. 10 are formed. After the first portion 61, the second portion 62 and the third portion 63 are formed in the above manner, the resist R1 is removed. By this process, the partition 6 is completed.

In the configuration of the partition 6 of the present embodiment, the aluminum alloy layer 621*s* is an etching stopper for the dry etching of the third layer 63*s* and the aluminum layer 622*s*. Thus, it is possible to prevent the corrosion of the first layer 61*s* and the rib 5 by the dry etching. If the first layer 61*s* formed of molybdenum is subjected to dry etching, the chamber of the etching device may become dirty because of molybdenum. When the dry etching is stopped by the aluminum alloy layer 621*s*, this dirt can be prevented.

Fourth Embodiment

Figure 12:
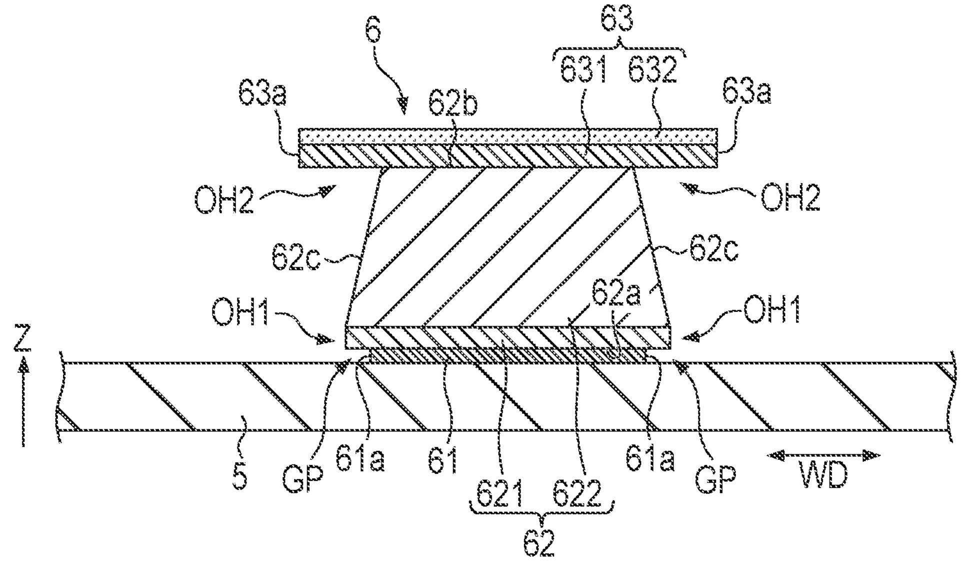
FIG. 12 is a schematic cross-sectional view of a partition according to a fourth embodiment.

FIG. 12 is a schematic cross-sectional view of a partition 6 according to the fourth embodiment. In this partition 6, in a manner similar to that of the second embodiment, a third portion 63 includes a titanium layer 631 and a conductive oxide layer 632, and in a manner similar to that of the third embodiment, a second portion 62 includes an aluminum alloy layer 621 and an aluminum layer 622. In a manner similar to that of the first embodiment, a first portion 61 is formed of molybdenum, and a rib 5 is formed of silicon nitride or silicon oxynitride.

For example, the thickness of the first portion 61 is 20 nm. The thickness of the aluminum alloy layer 621 is 50 nm. The thickness of the aluminum layer 622 is 450 nm. The thickness of the titanium layer 631 is 100 nm. The thickness of the conductive oxide layer 632 is 50 nm.

Figure 13A:
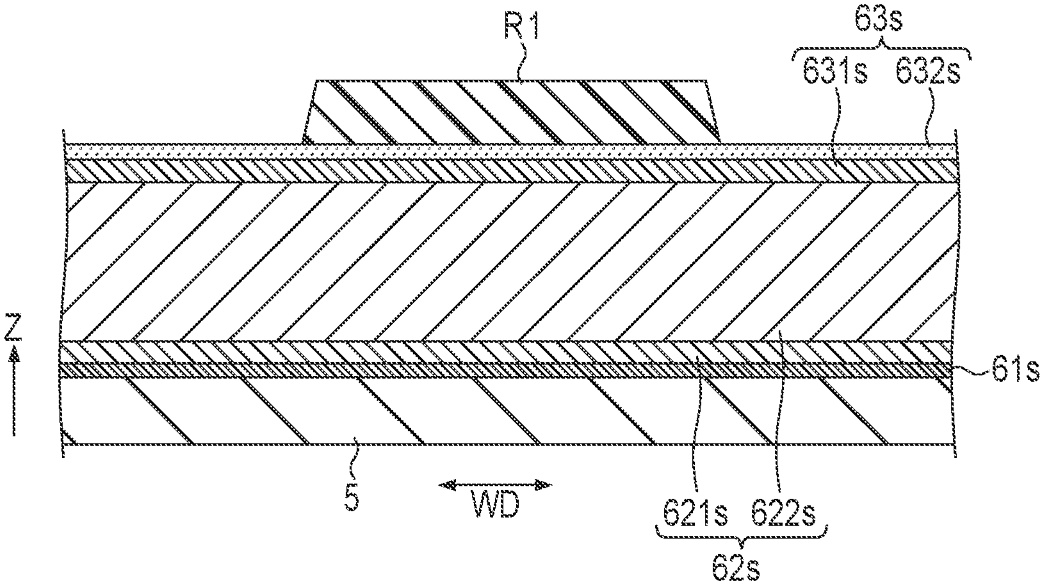
FIG. 13A is a diagram showing the process of forming the partition according to the fourth embodiment.

FIG. 13A to FIG. 13E are diagrams showing an example of the process of forming the partition 6 according to the present embodiment. First, as shown in FIG. 13A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum alloy layer 621*s* and an aluminum layer 622*s*. The third layer 63*s* includes a titanium layer 631*s* and a conductive oxide layer 632*s*.

Figure 13B:
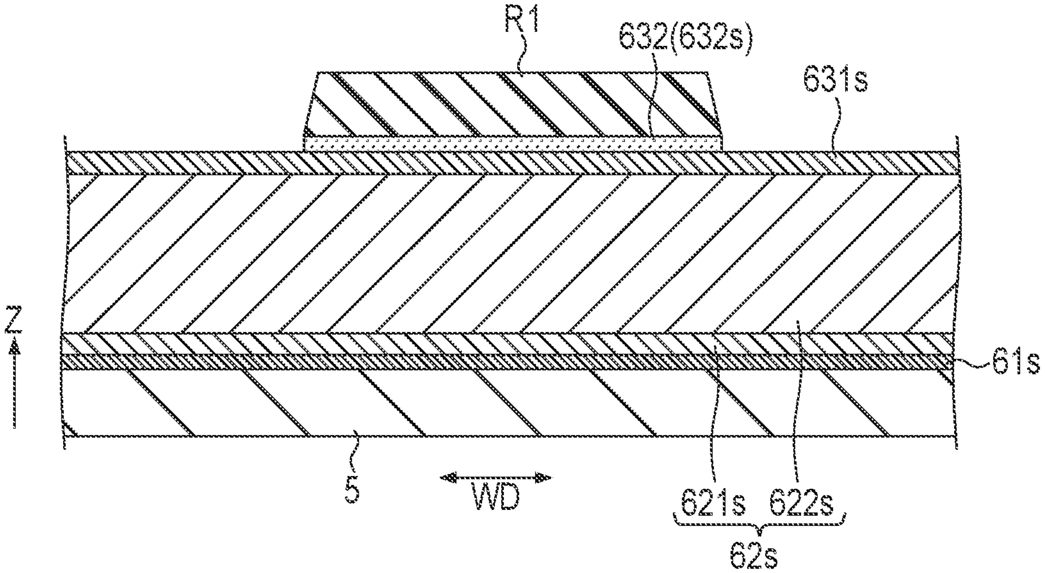
FIG. 13B is a diagram showing a process following FIG. 13A.

Subsequently, wet etching is applied using the resist R1 as a mask. As shown in FIG. 13B, of the conductive oxide layer 632*s*, the portion exposed from the resist R1 is removed. By this process, the conductive oxide layer 632 having the shape shown in FIG. 12 is formed.

Figure 13C:
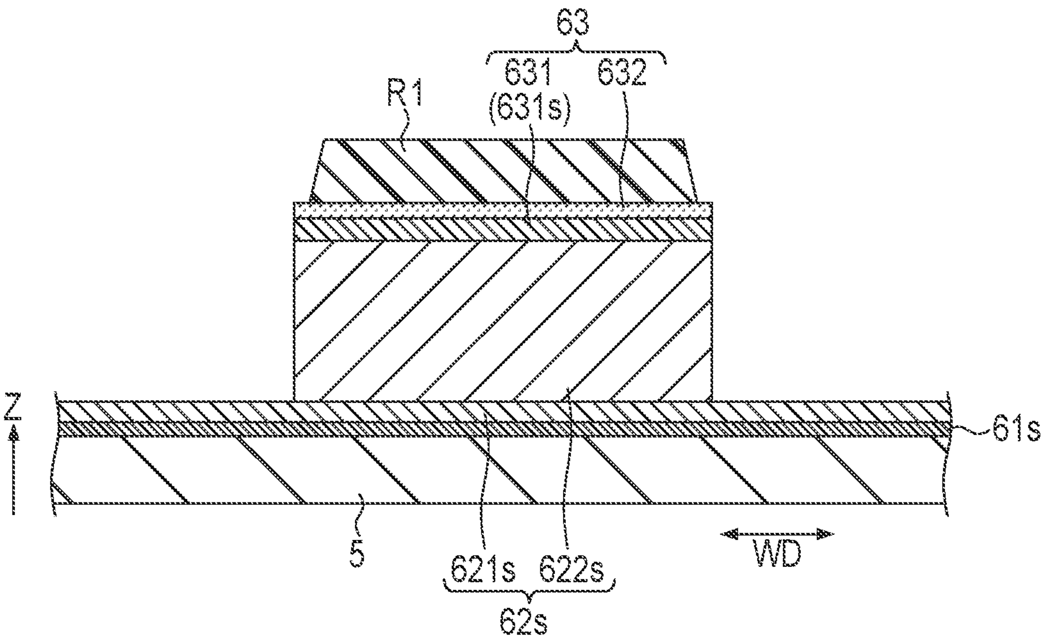
FIG. 13C is a diagram showing a process following FIG. 13B.

Further, dry etching employing, for example, a chlorine-based etching gas, is applied using the resist R1 as a mask. As shown in FIG. 13C, of the titanium layer 631*s*, the portion exposed from the resist R1 is removed. By this process, the titanium layer 631 having the shape shown in FIG. 12 is formed. In this dry etching, of the aluminum layer 622*s*, the portion exposed from the resist R1 is also removed. The aluminum alloy layer 621*s* functions as an etching stopper of the dry etching.

Figure 13D:
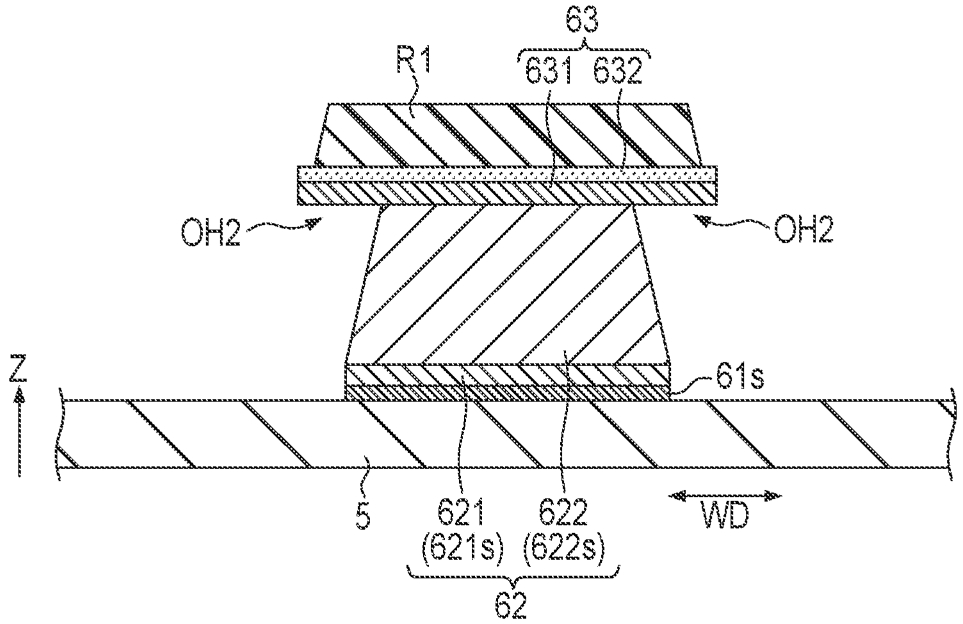
FIG. 13D is a diagram showing a process following FIG. 13C.

Subsequently, wet etching is applied. As shown in FIG. 13D, of the aluminum alloy layer 621*s*, the portion exposed from the resist R1 is removed. In this wet etching, the side surfaces of the aluminum alloy layer 621*s* and the aluminum layer 622*s* also corrode, and the widths of these layers are reduced. By this process, the second portion 62 including the aluminum alloy layer 621 and the aluminum layer 622 and second overhang structures OH2 having the shapes shown in FIG. 12 are formed. Further, in the wet etching, of the first layer 61*s*, the portion exposed from the second portion 62 is also removed.

Figure 13E:
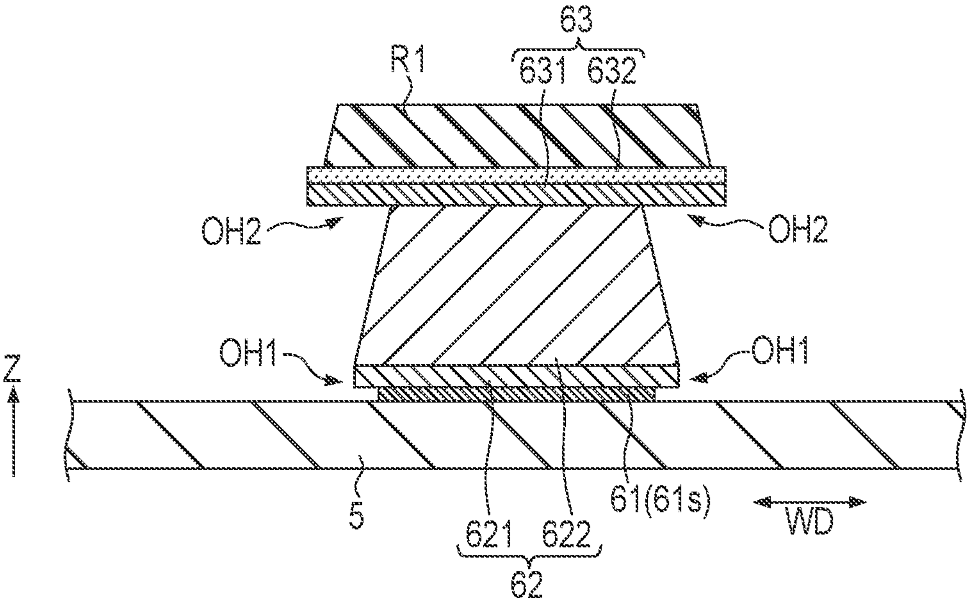
FIG. 13E is a diagram showing a process following FIG. 13D.

Subsequently, wet etching is applied again. For this wet etching, an etchant which corrodes the first layer 61*s* and does not easily corrode the second portion 62 is used. By this process, as shown in FIG. 13E, the width of the first layer 61*s* is reduced, and the first portion 61 and first overhang structures OH1 having the shapes shown in FIG. 12 are formed. After the first portion 61, the second portion 62 and the third portion 63 are formed in the above manner, the resist R1 is removed. By this process, the partition 6 is completed.

Fifth Embodiment

Figure 14:
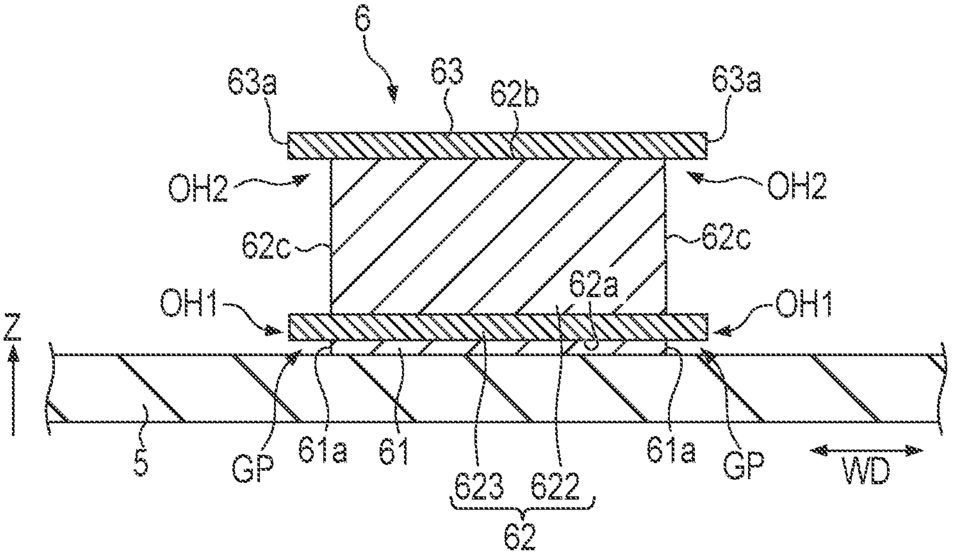
FIG. 14 is a schematic cross-sectional view of a partition according to a fifth embodiment.

FIG. 14 is a schematic cross-sectional view of a partition 6 according to the fifth embodiment. The partition 6 of the present embodiment comprises a first portion 61, a second portion 62 and a third portion 63 in a manner similar to that of the first embodiment. However, in the present embodiment, the second portion 62 includes an aluminum layer 622 formed of aluminum (pure aluminum) and a titanium layer 623 formed of titanium. Further, the first portion 61 is formed of aluminum (pure aluminum), and a rib 5 is formed of silicon oxynitride. The third portion 63 is formed of titanium.

The titanium layer 623 is provided on the first portion 61. The aluminum layer 622 is provided on the titanium layer 623. The titanium layer 623 protrudes to the both sides in a width direction WD relative to the first portion 61 and the aluminum layer 622. By this structure, first overhang structures OH1 are formed.

The titanium layer 623 is formed so as to be thinner than the aluminum layer 622. For example, the thickness of the first portion 61 is 20 nm. The thickness of the titanium layer 623 is 100 nm. The thickness of the aluminum layer 622 is 500 nm. The thickness of the third portion 63 is 100 nm.

Figure 15A:
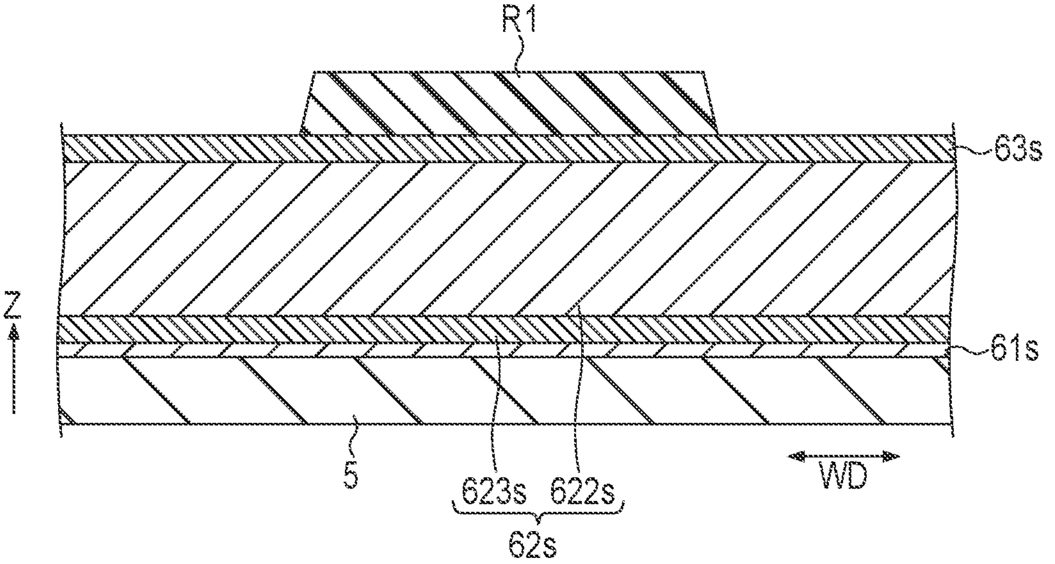
FIG. 15A is a diagram showing the process of forming the partition according to the fifth embodiment.
Figure 15B:
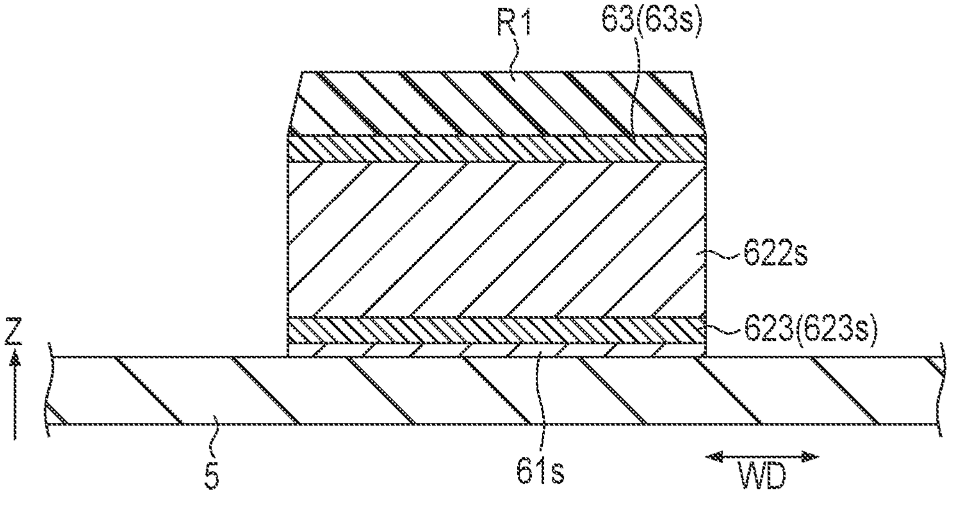
FIG. 15B is a diagram showing a process following FIG. 15A.
Figure 15C:
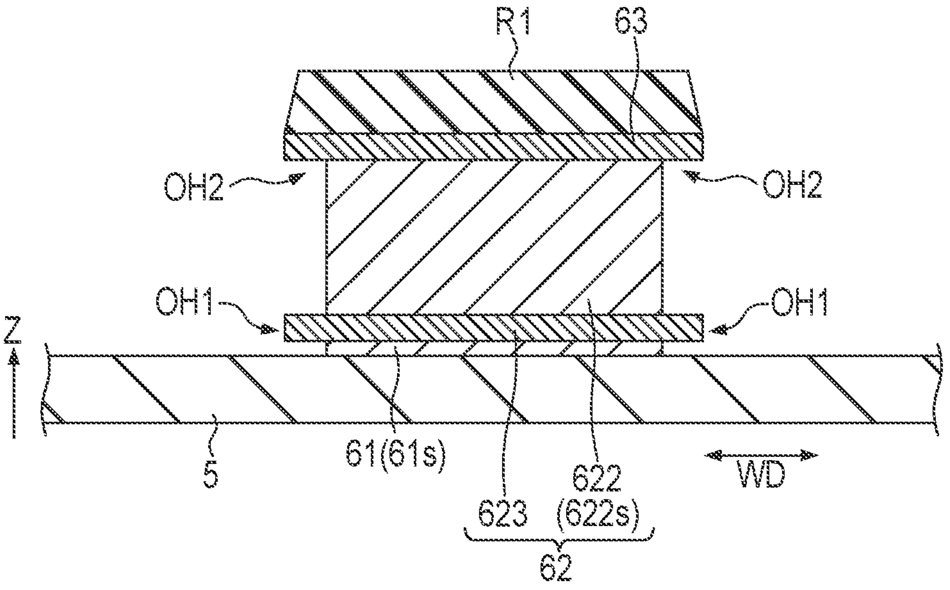
FIG. 15C is a diagram showing a process following FIG. 15B.

FIG. 15A to FIG. 15C are diagrams showing an example of the process of forming the partition 6 according to the present embodiment. First, as shown in FIG. 15A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s* and a titanium layer 623*s*.

Subsequently, anisotropic dry etching employing, for example, a chlorine-based etching gas, is applied using the resist R1 as a mask. As shown in FIG. 15B, of the third layer 63*s*, the portion exposed from the resist R1 is removed. By this process, the third portion 63 having the shape shown in FIG. 14 is formed. In this dry etching, of the aluminum layer 622*s*, the titanium layer 623*s* and the first layer 61*s*, the portions exposed from the resist R1 are also removed. The rib 5 formed of silicon oxynitride functions as an etching stopper of the dry etching.

Subsequently, isotropic wet etching is applied. As shown in FIG. 15C, the widths of the aluminum layer 622*s* and the first layer 61*s* are reduced. By this process, the first portion 61 and the second portion 62 including the aluminum layer 622 and the titanium layer 623 having the shapes shown in FIG. 14 are formed. Subsequently, the partition 6 is completed by removing the resist R1.

In the configuration of the partition 6 of the present embodiment, the first layer 61*s*, the second layer 62*s* and the third layer 63*s* can be patterned at the same time by dry etching using the rib 5 as an etching stopper. Further, the widths of the first portion 61 and the aluminum layer 622 can be reduced by a single wet etching to form overhang structures OH1 and OH2.

Sixth Embodiment

Figure 16:
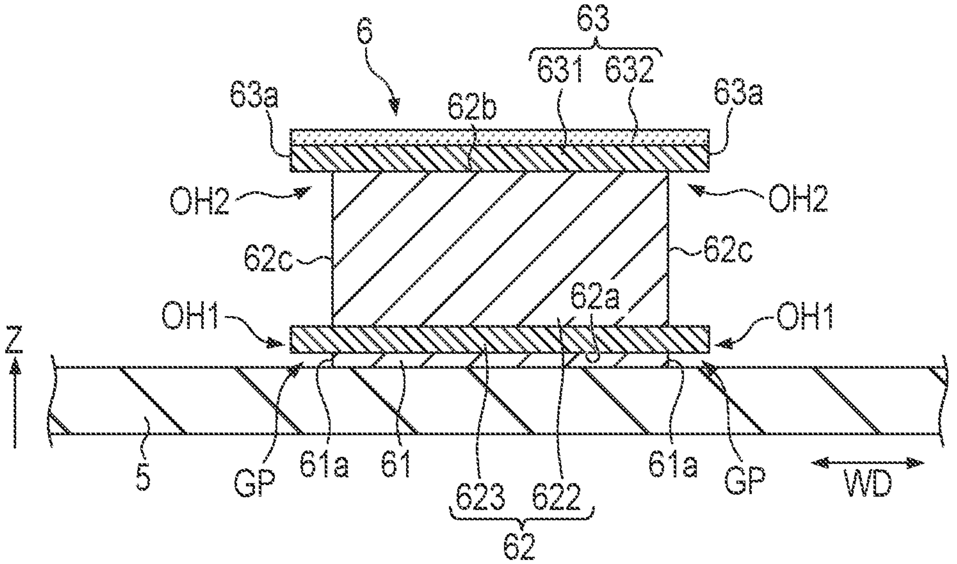
FIG. 16 is a schematic cross-sectional view of a partition according to a sixth embodiment.

FIG. 16 is a schematic cross-sectional view of a partition 6 according to the sixth embodiment. In the partition 6 of the present embodiment, in a manner similar to that of the second embodiment, a third portion 63 includes a titanium layer 631 and a conductive oxide layer 632, and in a manner similar to that of the fifth embodiment, a second portion 62 includes an aluminum layer 622 and a titanium layer 623. Further, in a manner similar to that of the fifth embodiment, a first portion 61 is formed of aluminum, and a rib 5 is formed of silicon oxynitride.

For example, the thickness of the first portion 61 is 20 nm. The thickness of the titanium layer 623 is 100 nm. The thickness of the aluminum layer 622 is 500 nm. The thickness of the titanium layer 631 is 100 nm. The thickness of the conductive oxide layer 632 is 50 nm.

Figure 17A:
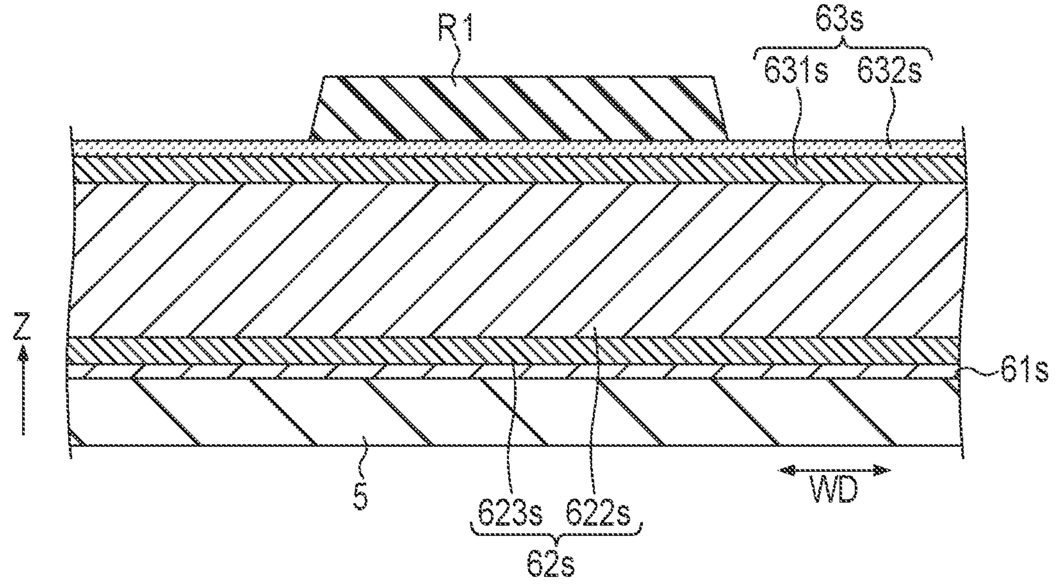
FIG. 17A is a diagram showing the process of forming the partition according to the sixth embodiment.

FIG. 17A to FIG. 17D are diagrams showing an example of the process of forming the partition 6 according to the present embodiment. First, as shown in FIG. 17A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s* and a titanium layer 623*s*. The third layer 63*s* includes a titanium layer 631*s* and a conductive oxide layer 632*s*.

Figure 17B:
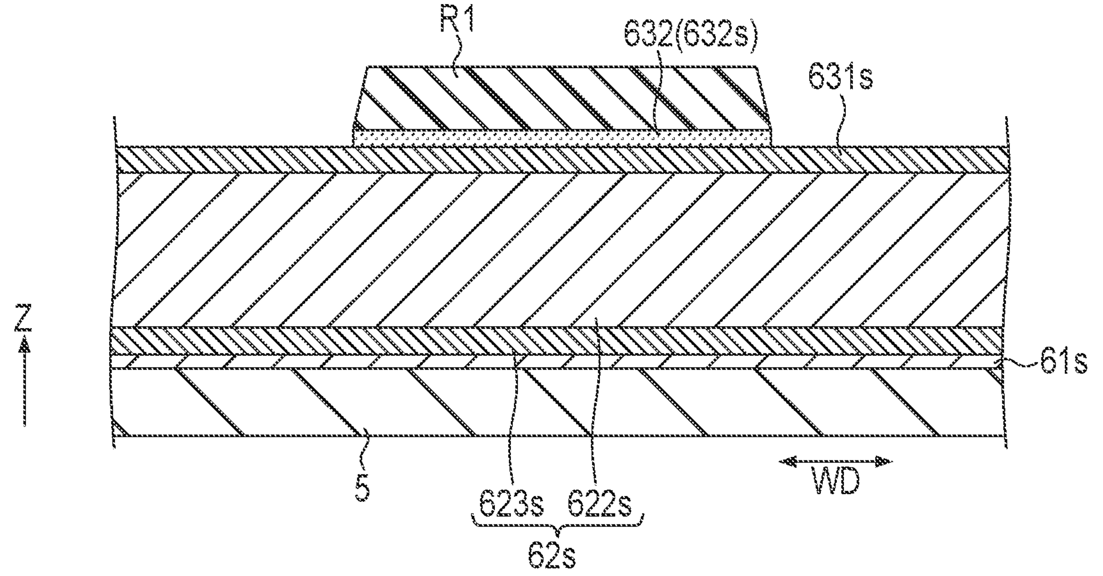
FIG. 17B is a diagram showing a process following FIG. 17A.

Subsequently, wet etching is applied using the resist R1 as a mask. As shown in FIG. 17B, of the conductive oxide layer 632*s*, the portion exposed from the resist R1 is removed. By this process, the conductive oxide layer 632 having the shape shown in FIG. 16 is formed.

Figure 17C:
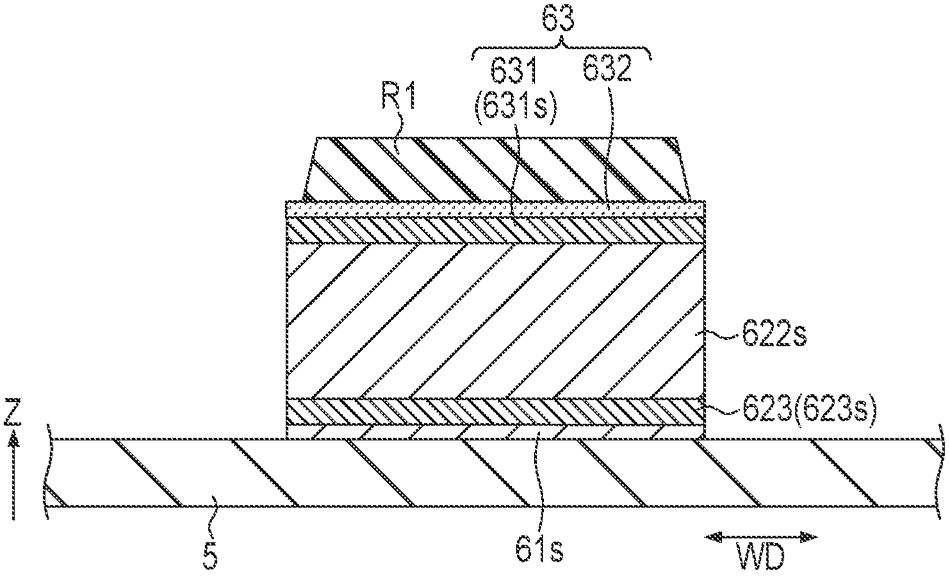
FIG. 17C is a diagram showing a process following FIG. 17B.

Further, anisotropic dry etching employing, for example, a chlorine-based etching gas, is applied using the resist R1 as a mask. As shown in FIG. 17C, of the titanium layer 631*s*, the portion exposed from the resist R1 is removed. By this process, the titanium layer 631 having the shape shown in FIG. 16 is formed. In this dry etching, of the aluminum layer 622*s*, the titanium layer 623*s* and the first layer 61*s*, the portions exposed from the resist R1 are also removed. The rib 5 formed of silicon oxynitride functions as an etching stopper of the dry etching.

Figure 17D:
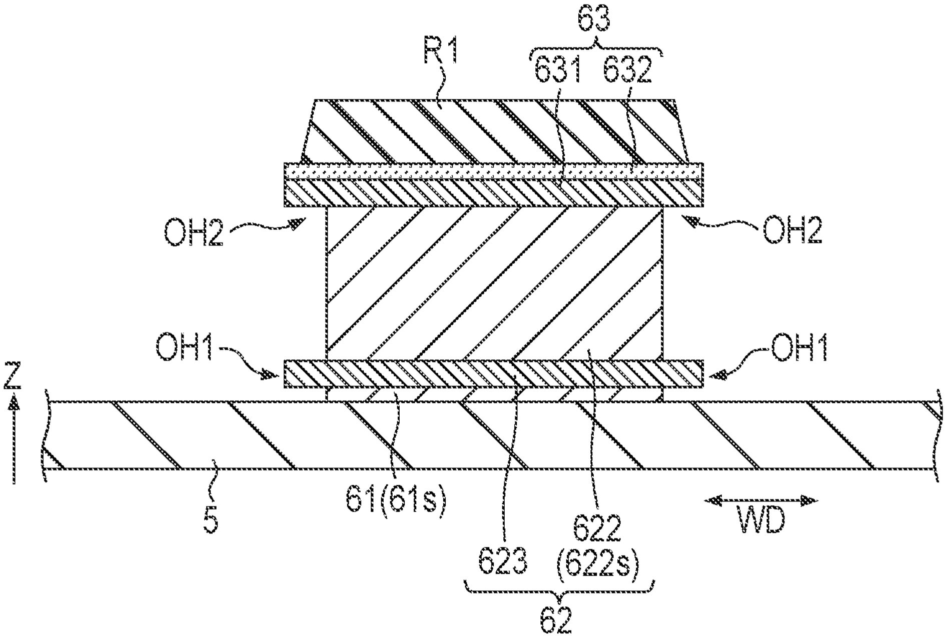
FIG. 17D is a diagram showing a process following FIG. 17C.

Subsequently, isotropic wet etching is applied. As shown in FIG. 17D, the widths of the aluminum layer 622*s* and the first layer 61*s* are reduced. By this process, the first portion 61 and the second portion 62 including the aluminum layer 622 and the titanium layer 623 having the shapes shown in FIG. 16 are formed. Subsequently, the partition 6 is completed by removing the resist R1.

Seventh Embodiment

Figure 18:
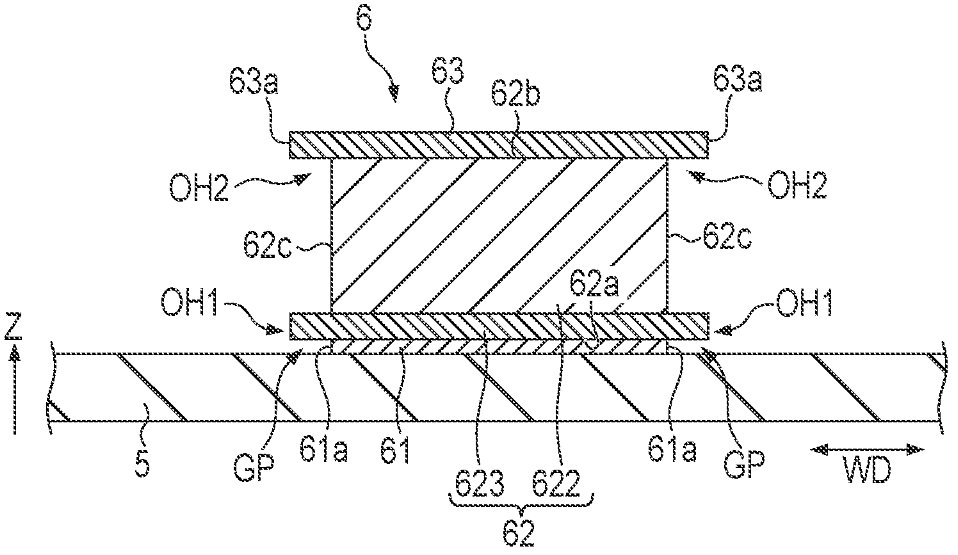
FIG. 18 is a schematic cross-sectional view of a partition according to a seventh embodiment.

FIG. 18 is a schematic cross-sectional view of a partition 6 according to the seventh embodiment. In the partition 6 of the present embodiment, in a manner similar to that of the partition 6 of fifth embodiment shown in FIG. 14, a second portion 62 includes an aluminum layer 622 and a titanium layer 623. However, in the present embodiment, a first portion 61 is formed of an aluminum alloy such as an aluminum-neodymium alloy or an aluminum-silicon alloy. For example, a third portion 63 is formed of titanium, and a rib 5 is formed of silicon nitride or silicon oxynitride.

For example, the thickness of the first portion 61 is 20 nm. The thickness of the titanium layer 623 is 100 nm. The thickness of the aluminum layer 622 is 500 nm. The thickness of the third portion 63 is 100 nm.

Figure 19A:
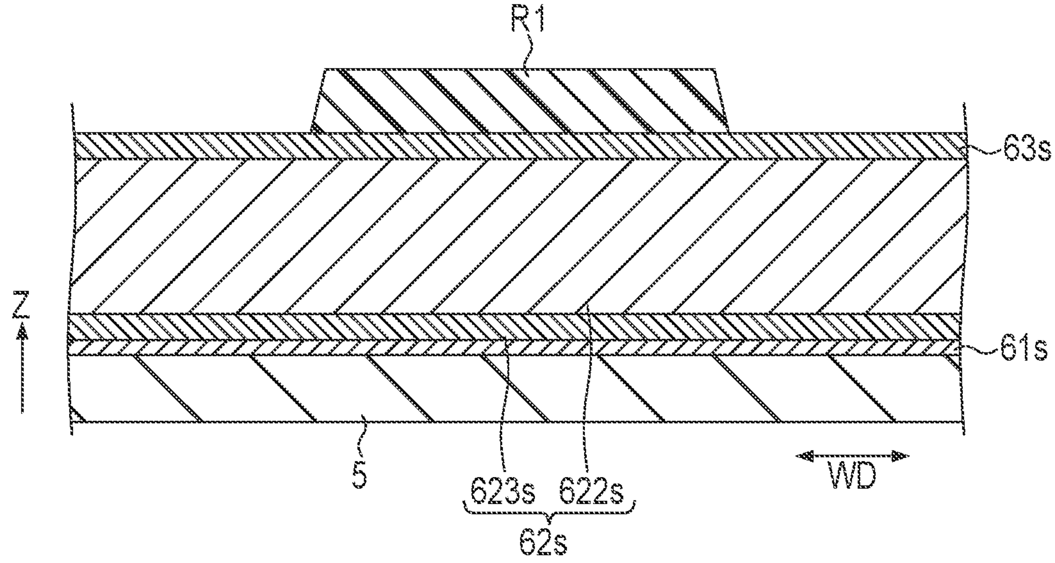
FIG. 19A is a diagram showing the process of forming the partition according to the seventh embodiment.
Figure 19B:
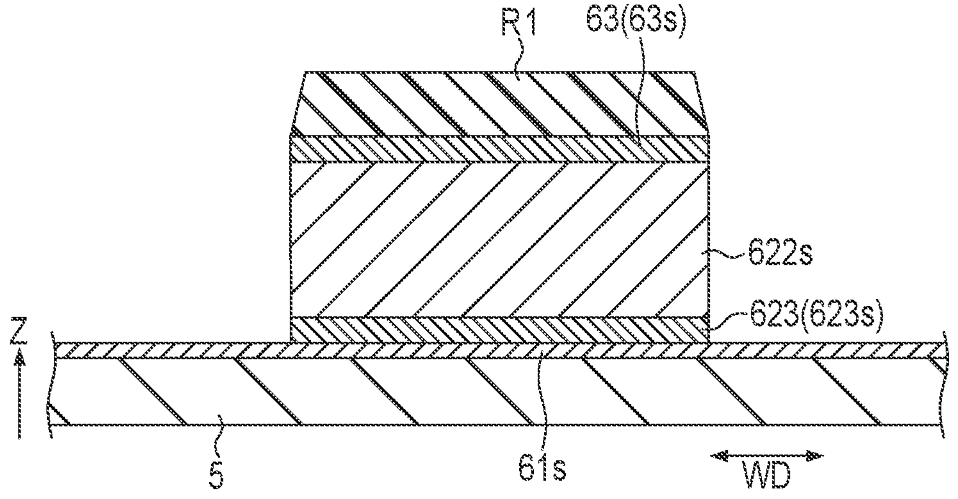
FIG. 19B is a diagram showing a process following FIG. 19A.
Figure 19C:
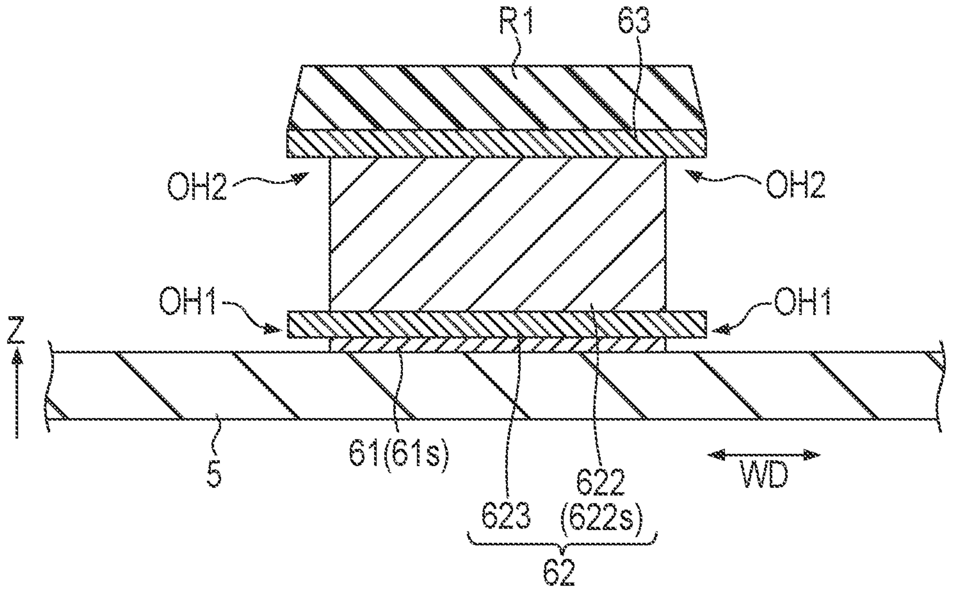
FIG. 19C is a diagram showing a process following FIG. 19B.

FIG. 19A to FIG. 19C are diagrams showing an example of the process of forming the partition 6 according to the present embodiment. First, as shown in FIG. 19A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s* and a titanium layer 623*s*.

Subsequently, anisotropic dry etching employing, for example, a chlorine-based etching gas, is applied using the resist R1 as a mask. As shown in FIG. 19B, of the third layer 63*s*, the portion exposed from the resist R1 is removed. By this process, the third portion 63 having the shape shown in FIG. 18 is formed. In this dry etching, of the aluminum layer 622*s* and the titanium layer 623*s*, the portions exposed from the resist R1 are also removed. The first layer 61*s* formed of an aluminum alloy functions as an etching stopper of the dry etching.

Subsequently, isotropic wet etching is applied. As shown in FIG. 19C, the width of the aluminum layer 622*s* is reduced. In this wet etching, of the first layer 61*s*, the portion exposed from the titanium layer 623 is removed, and the width of the first layer 61*s* is reduced under the titanium layer 623. By this process, the first portion 61 and the second portion 62 including the aluminum layer 622 and the titanium layer 623 having the shapes shown in FIG. 18 are formed. Subsequently, the partition 6 is completed by removing the resist R1.

Eighth Embodiment

Figure 20:
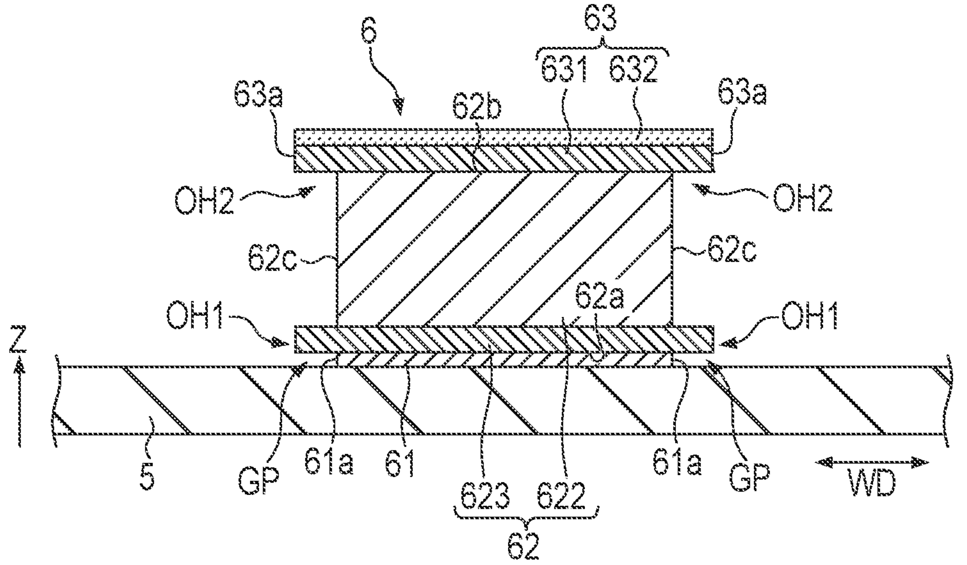
FIG. 20 is a schematic cross-sectional view of a partition according to an eighth embodiment.

FIG. 20 is a schematic cross-sectional view of a partition 6 according to the eighth embodiment. In the partition 6 of the present embodiment, in a manner similar to that of the partition 6 of the sixth embodiment shown in FIG. 16, a second portion 62 includes an aluminum layer 622 and a titanium layer 623, and a third portion 63 includes a titanium layer 631 and a conductive oxide layer 632. However, in the present embodiment, a first portion 61 is formed of an aluminum alloy such as an aluminum-neodymium alloy or an aluminum-silicon alloy. A rib 5 is formed of, for example, silicon nitride or silicon oxynitride.

For example, the thickness of the first portion 61 is 20 nm. The thickness of the titanium layer 623 is 100 nm. The thickness of the aluminum layer 622 is 500 nm. The thickness of the titanium layer 631 is 100 nm. The thickness of the conductive oxide layer 632 is 50 nm.

Figure 21A:
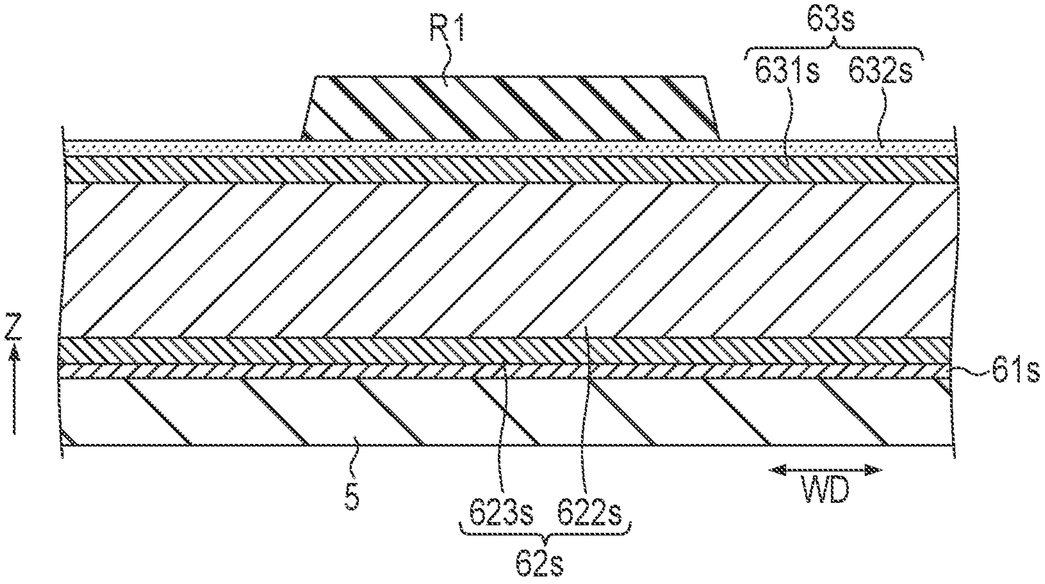
FIG. 21A is a diagram showing the process of forming the partition according to the eighth embodiment.

FIG. 21A to FIG. 21D are diagrams showing an example of the process of forming the partition 6 according to the present embodiment. First, as shown in FIG. 21A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s* and a titanium layer 623*s*. The third layer 63*s* includes a titanium layer 631*s* and a conductive oxide layer 632*s*.

Figure 21B:
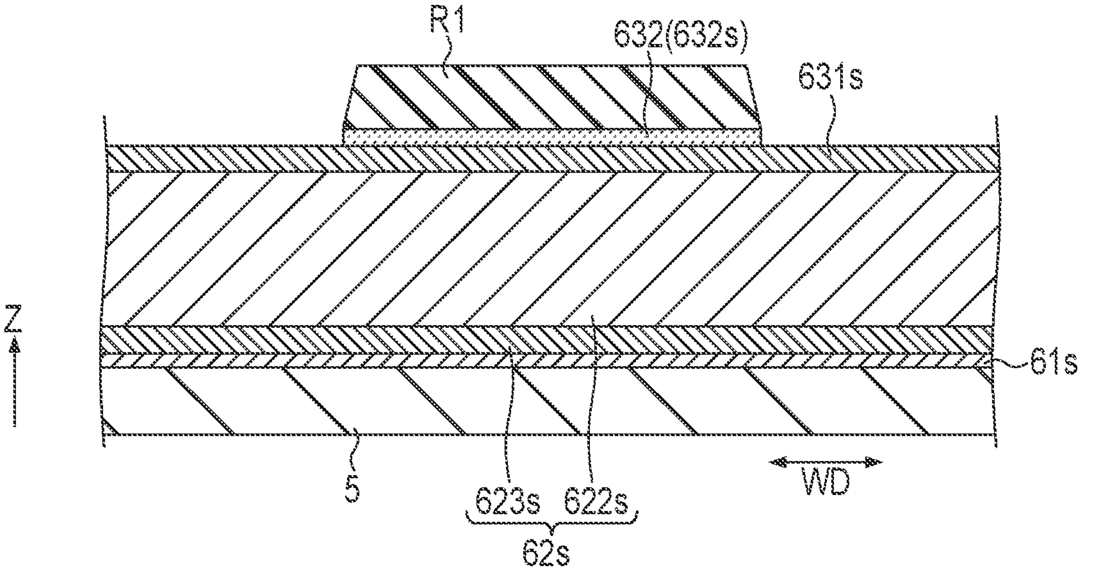
FIG. 21B is a diagram showing a process following FIG. 21A.

Subsequently, wet etching is applied using the resist R1 as a mask. As shown in FIG. 21B, of the conductive oxide layer 632*s*, the portion exposed from the resist R1 is removed. By this process, the conductive oxide layer 632 having the shape shown in FIG. 20 is formed.

Figure 21C:
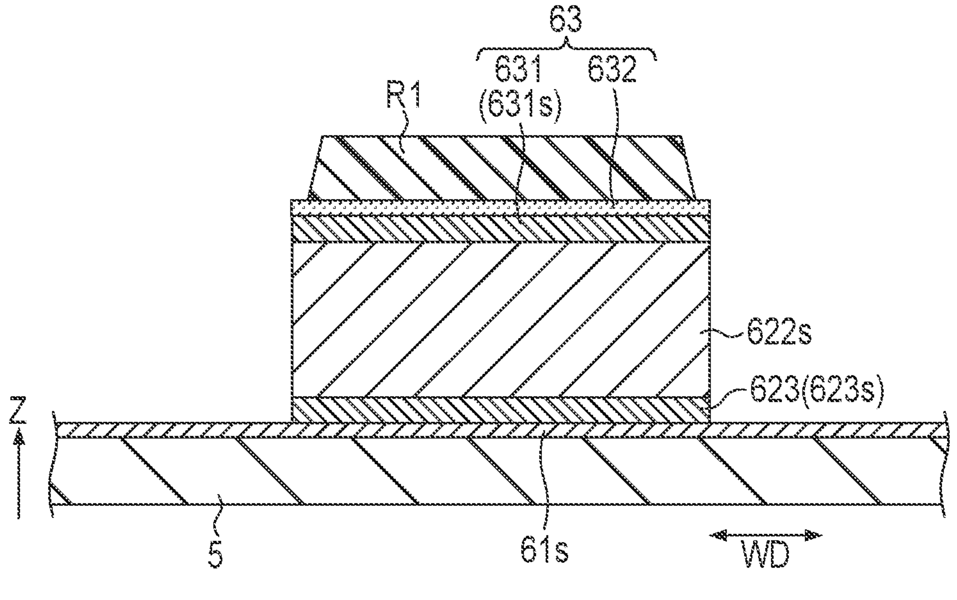
FIG. 21C is a diagram showing a process following FIG. 21B.

Further, anisotropic dry etching employing, for example, a chlorine-based etching gas, is applied using the resist R1 as a mask. As shown in FIG. 21C, of the titanium layer 631*s*, the portion exposed from the resist R1 is removed. By this process, the titanium layer 631 having the shape shown in FIG. 20 is formed. In this dry etching, of the aluminum layer 622*s* and the titanium layer 623*s*, the portions exposed from the resist R1 are also removed. The first layer 61*s* formed of an aluminum alloy functions as an etching stopper of the dry etching.

Figure 21D:
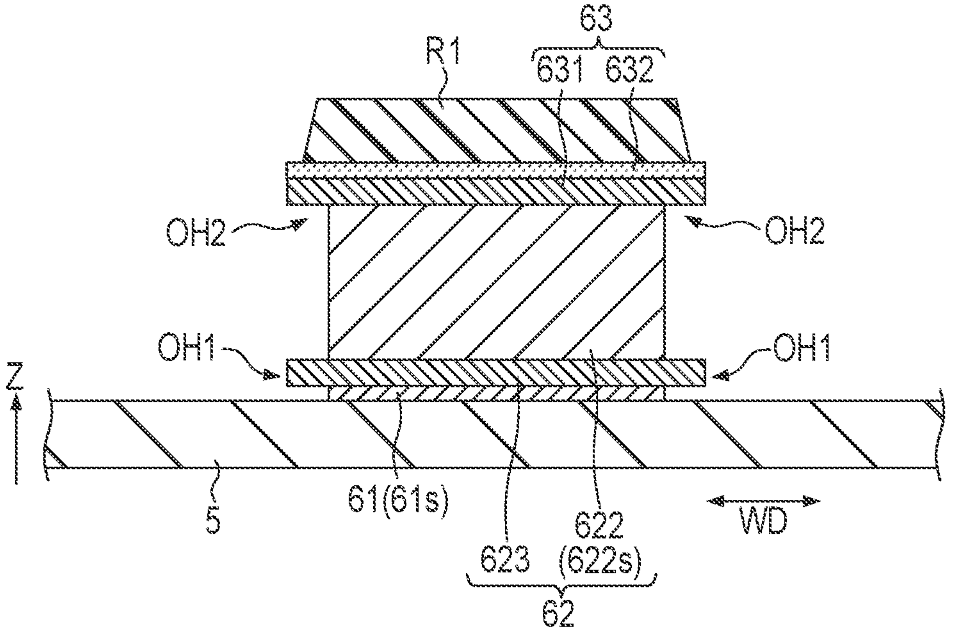
FIG. 21D is a diagram showing a process following FIG. 21C.

Subsequently, isotropic wet etching is applied. As shown in FIG. 21D, the width of the aluminum layer 622*s* is reduced. In this wet etching, of the first layer 61*s*, the portion exposed from the titanium layer 623 is removed, and the width of the first layer 61*s* is reduced under the titanium layer 623. By this process, the first portion 61 and the second portion 62 including the aluminum layer 622 and the titanium layer 623 having the shapes shown in FIG. 20 are formed. Subsequently, the partition 6 is completed by removing the resist R1.

Ninth Embodiment

Figure 22:
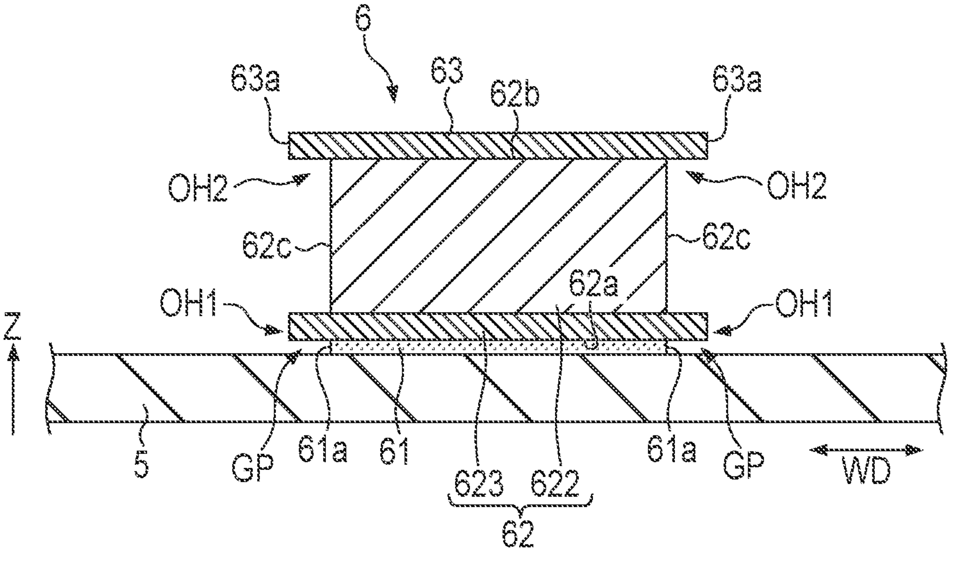
FIG. 22 is a schematic cross-sectional view of a partition according to a ninth embodiment.

FIG. 22 is a schematic cross-sectional view of a partition 6 according to the ninth embodiment. In the partition 6 of the present embodiment, in a manner similar to that of the partition 6 of the fifth embodiment shown in FIG. 14, a second portion 62 includes an aluminum layer 622 and a titanium layer 623. However, in the present embodiment, a first portion 61 is formed of conductive oxide such as ITO, IZO and IGZO. A rib 5 is formed of, for example, silicon nitride or silicon oxynitride.

For example, the thickness of the first portion 61 is 20 nm. The thickness of the titanium layer 623 is 100 nm. The thickness of the aluminum layer 622 is 500 nm. The thickness of a third portion 63 is 100 nm.

Figure 23A:
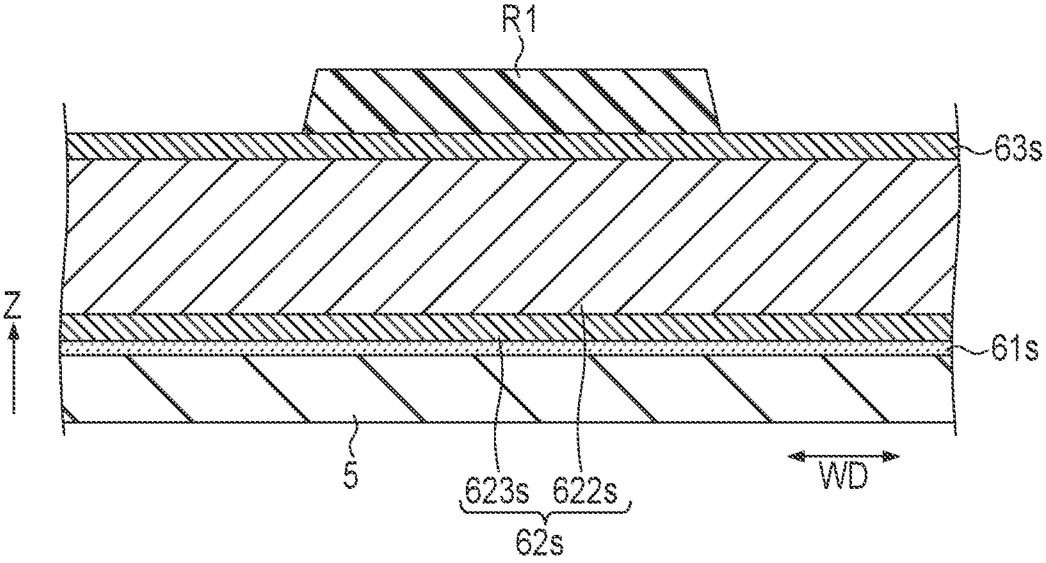
FIG. 23A is a diagram showing the process of forming the partition according to the ninth embodiment.

FIG. 23A to FIG. 23D are diagrams showing an example of the process of forming the partition 6 according to the present embodiment. First, as shown in FIG. 23A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s* and a titanium layer 623*s*.

Figure 23B:
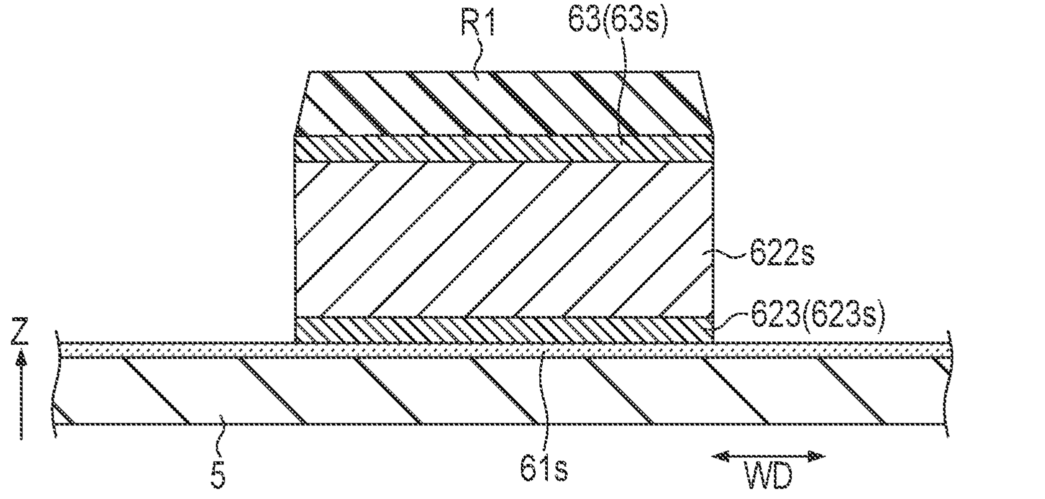
FIG. 23B is a diagram showing a process following FIG. 23A.

Subsequently, anisotropic dry etching employing, for example, a chlorine-based etching gas, is applied using the resist R1 as a mask. As shown in FIG. 23B, of the third layer 63*s*, the portion exposed from the resist R1 is removed. By this process, the third portion 63 having the shape shown in FIG. 22 is formed. In this dry etching, of the aluminum layer 622*s* and the titanium layer 623*s*, the portions exposed from the resist R1 are also removed. The first layer 61*s* formed of conductive oxide functions as an etching stopper of the dry etching.

Figure 23C:
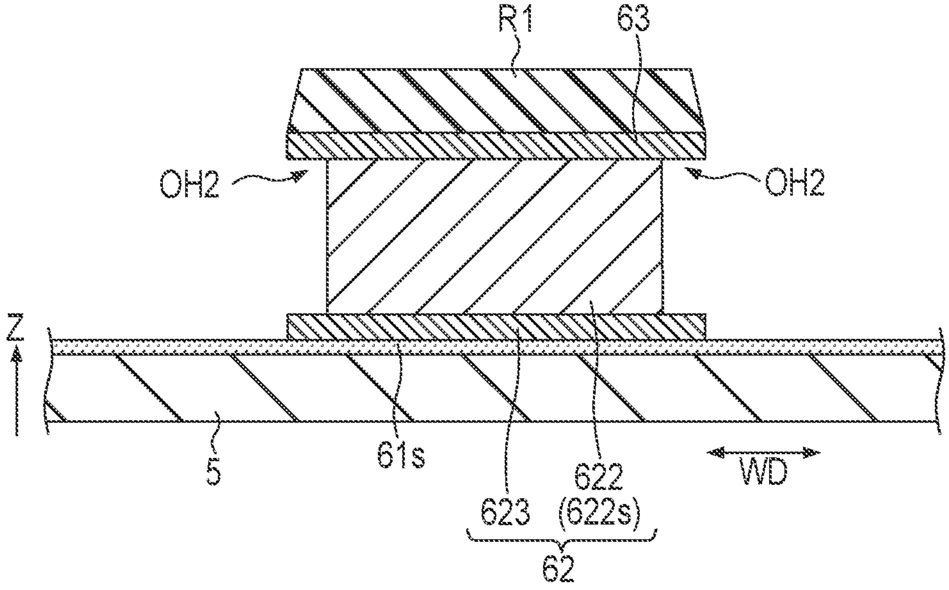
FIG. 23C is a diagram showing a process following FIG. 23B.

Subsequently, isotropic wet etching is applied. As shown in FIG. 23C, the width of the aluminum layer 622*s* is reduced. By this process, the second portion 62 including the aluminum layer 622 and the titanium layer 623 having the shapes shown in FIG. 22 is formed.

Figure 23D:
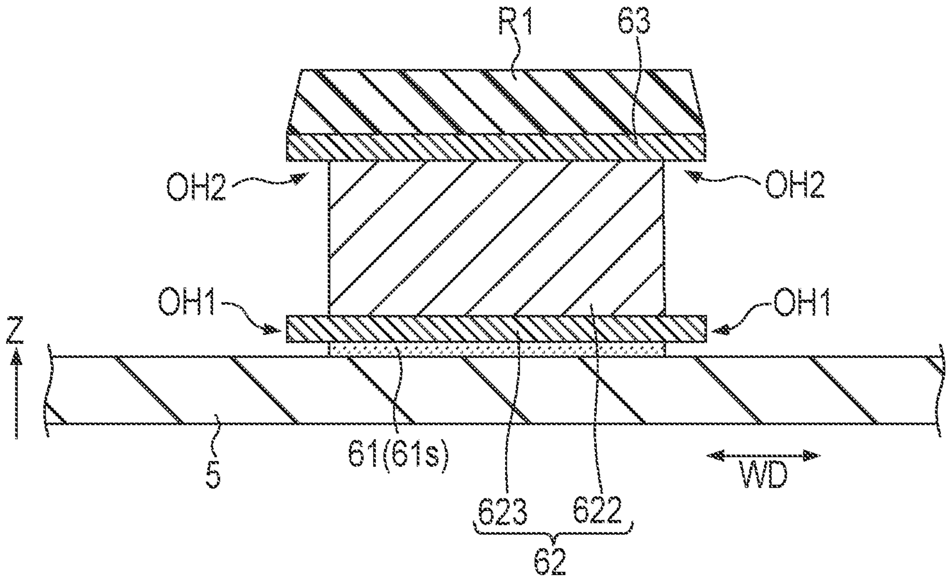
FIG. 23D is a diagram showing a process following FIG. 23C.

Subsequently, wet etching is applied again. For this wet etching, an etchant which corrodes the first layer 61*s* formed of conductive oxide and does not easily corrode the aluminum layer 622, the titanium layer 623 or the third portion 63 is used. By this process, as shown in FIG. 23D, of the first layer 61*s*, the portion exposed from the titanium layer 623 is removed, and the width of the first layer 61*s* is reduced under the titanium layer 623, and the first portion 61 and first overhang structures OH1 having the shapes shown in FIG. 22 are formed. Subsequently, the partition 6 is completed by removing the resist R1.

Tenth Embodiment

Figure 24:
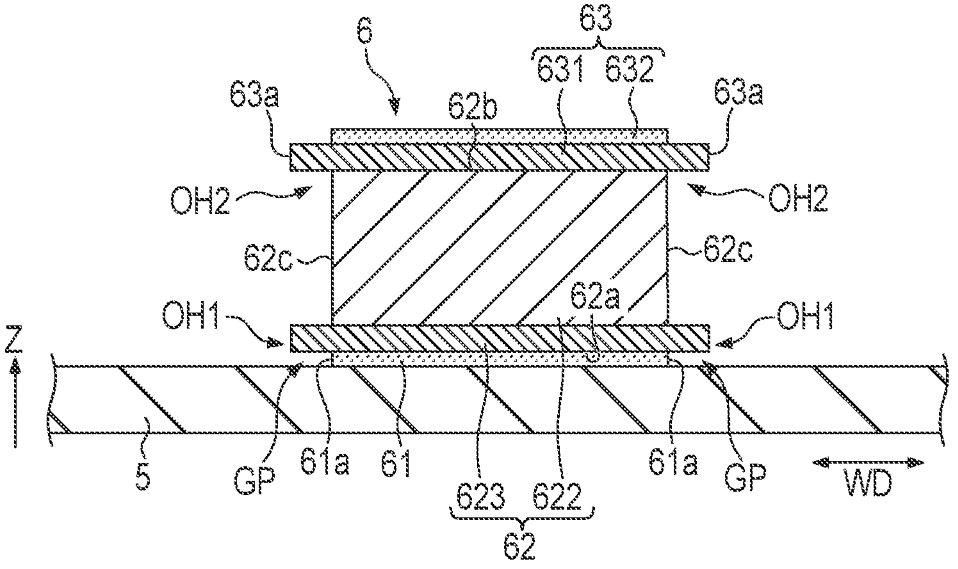
FIG. 24 is a schematic cross-sectional view of a partition according to a tenth embodiment.

FIG. 24 is a schematic cross-sectional view of a partition 6 according to the tenth embodiment. In the partition 6 of the present embodiment, in a manner similar to that of the partition 6 of the sixth embodiment shown in FIG. 16, a second portion 62 includes an aluminum layer 622 and a titanium layer 623, and a third portion 63 includes a titanium layer 631 and a conductive oxide layer 632. Further, in the present embodiment, in a manner similar to that of the ninth embodiment, a first portion 61 is formed of conductive oxide. In the example of FIG. 24, the width of the conductive oxide layer 632 is less than that of the titanium layer 631.

For example, the thickness of the first portion 61 is 20 nm. The thickness of the titanium layer 623 is 100 nm. The thickness of the aluminum layer 622 is 500 nm. The thickness of the titanium layer 631 is 100 nm. The thickness of the conductive oxide layer 632 is 50 nm.

Figure 25A:
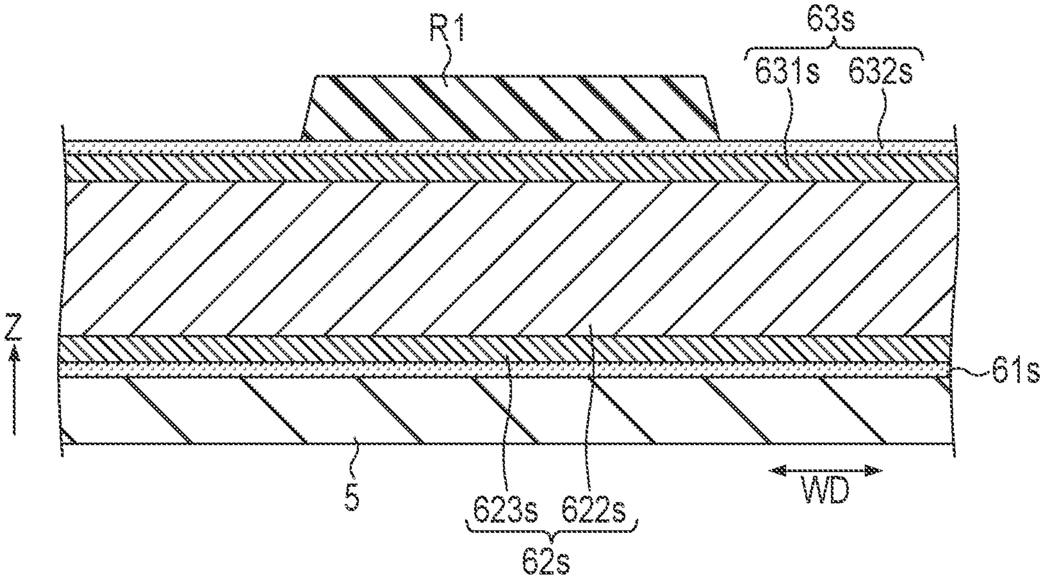
FIG. 25A is a diagram showing the process of forming the partition according to the tenth embodiment.

FIG. 25A to FIG. 25E are diagrams showing an example of the process of forming the partition 6 according to the present embodiment. First, as shown in FIG. 25A, a first layer 61*s* which is the base of the first portion 61, a second layer 62*s* which is the base of the second portion 62, a third layer 63*s* which is the base of the third portion 63 and a resist R1 are formed in order above a rib 5. The second layer 62*s* includes an aluminum layer 622*s* and a titanium layer 623*s*. The third layer 63*s* includes a titanium layer 631*s* and a conductive oxide layer 632*s*.

Figure 25B:
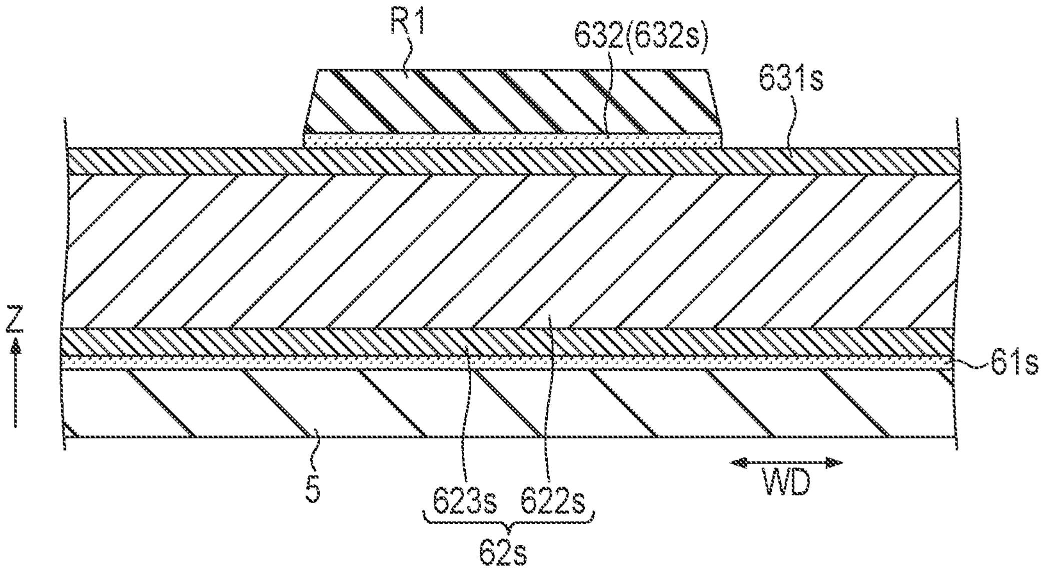
FIG. 25B is a diagram showing a process following FIG. 25A.

Subsequently, wet etching is applied using the resist R1 as a mask. As shown in FIG. 25B, of the conductive oxide layer 632*s*, the portion exposed from the resist R1 is removed. By this process, the conductive oxide layer 632 having the shape shown in FIG. 24 is formed.

Figure 25C:
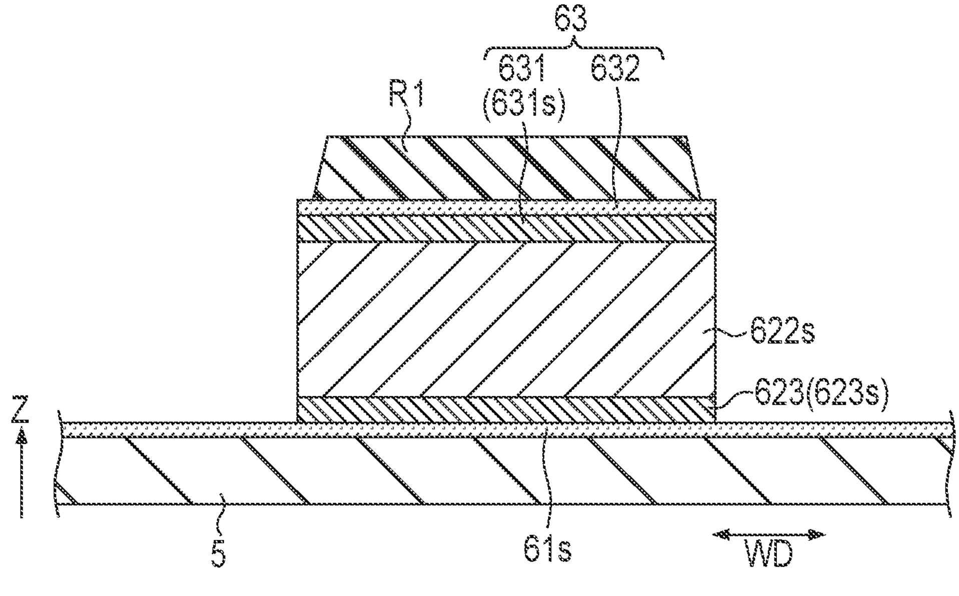
FIG. 25C is a diagram showing a process following FIG. 25B.

Further, anisotropic dry etching employing, for example, a chlorine-based etching gas, is applied using the resist R1 as a mask. As shown in FIG. 25C, of the titanium layer 631*s*, the portion exposed from the resist R1 is removed. By this process, the titanium layer 631 having the shape shown in FIG. 24 is formed. In this dry etching, of the aluminum layer 622*s* and the titanium layer 623*s*, the portions exposed from the resist R1 are also removed. The first layer 61*s* formed of conductive oxide functions as an etching stopper of the dry etching. In the example of FIG. 25C, in the dry etching, the width of the resist R1 is slightly reduced.

Figure 25D:
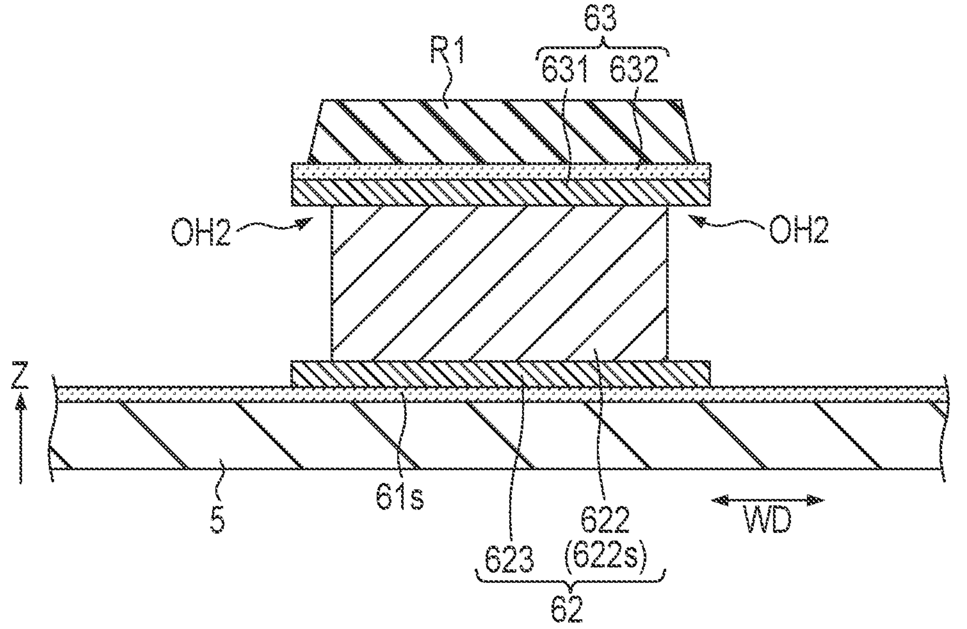
FIG. 25D is a diagram showing a process following FIG. 25C.

Subsequently, isotropic wet etching is applied. As shown in FIG. 25D, the width of the aluminum layer 622*s* is reduced. By this process, the second portion 62 including the aluminum layer 622 and the titanium layer 623 having the shapes shown in FIG. 24 are formed.

Figure 25E:
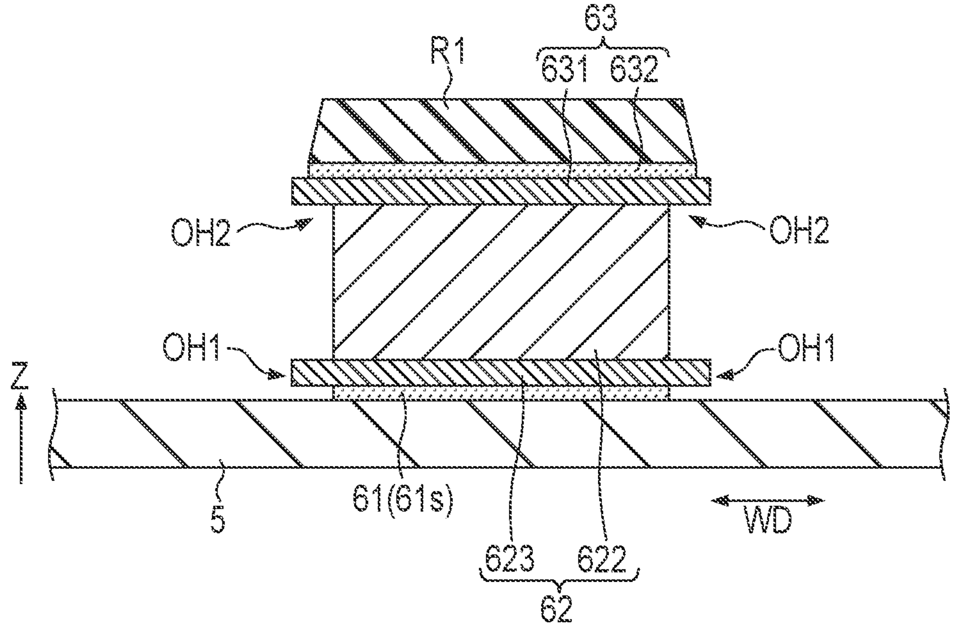
FIG. 25E is a diagram showing a process following FIG. 25D.

Subsequently, wet etching is applied again. For this wet etching, an etchant which corrodes the first layer 61*s* formed of conductive oxide and does not easily corrode the aluminum layer 622 or the titanium layer 623 or 631 is used. By this process, as shown in FIG. 25E, of the first layer 61*s*, the portion exposed from the titanium layer 623 is removed, and the width of the first layer 61*s* is reduced under the titanium layer 623, and the first portion 61 and first overhang structures OH1 having the shapes shown in FIG. 24 are formed. In this wet etching, of the conductive oxide layer 632, the both end portions exposed from the resist R1 also corrode. Subsequently, the partition 6 is completed by removing the resist R1.

Eleventh Embodiment

Figure 26:
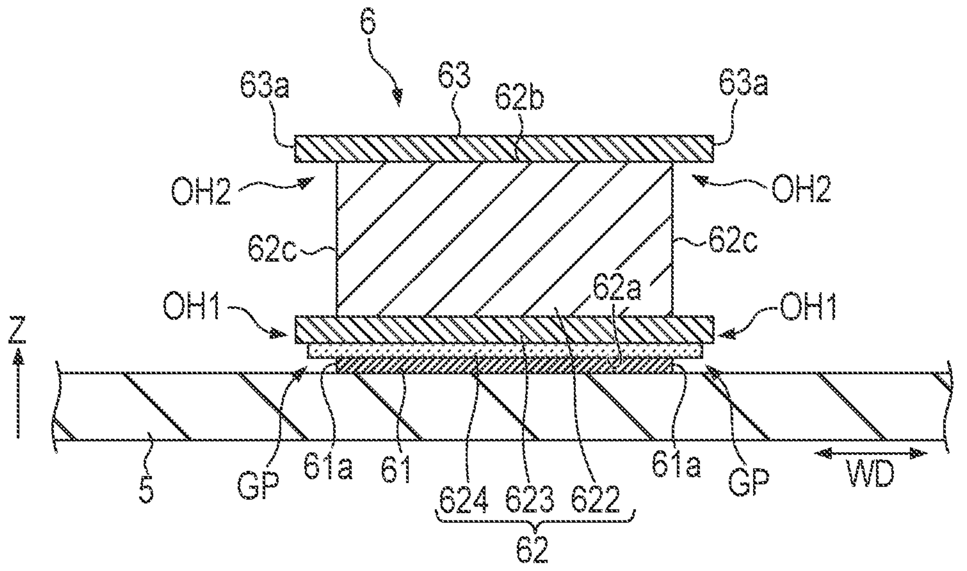
FIG. 26 is a schematic cross-sectional view of a partition according to an eleventh embodiment.

FIG. 26 is a schematic cross-sectional view of a partition 6 according to the eleventh embodiment. In the partition 6 of the present embodiment, in a manner similar to that of the partition 6 of the fifth embodiment shown in FIG. 14, a second portion 62 includes an aluminum layer 622 and a titanium layer 623. Further, in the present embodiment, the second portion 62 includes a conductive oxide layer 624 formed of conductive oxide such as ITO, IZO and IGZO. A first portion 61 is formed of molybdenum, and a third portion 63 is formed of titanium. A rib 5 is formed of, for example, silicon nitride or silicon oxynitride.

The conductive oxide layer 624 is provided on the first portion 61. The titanium layer 623 is provided on the conductive oxide layer 624. The aluminum layer 622 is provided on the titanium layer 623. The titanium layer 623 and the conductive oxide layer 624 protrude to the both sides in a width direction WD relative to the first portion 61 to form first overhang structures OH1. In the example of FIG. 26, the width of the conductive oxide layer 624 is less than that of the titanium layer 623.

For example, the thickness of the first portion 61 is 20 nm. The thickness of the conductive oxide layer 624 is 50 nm. The thickness of the titanium layer 623 is 100 nm. The thickness of the aluminum layer 622 is 500 nm. The thickness of the third portion 63 is 100 nm.

Figure 27A:
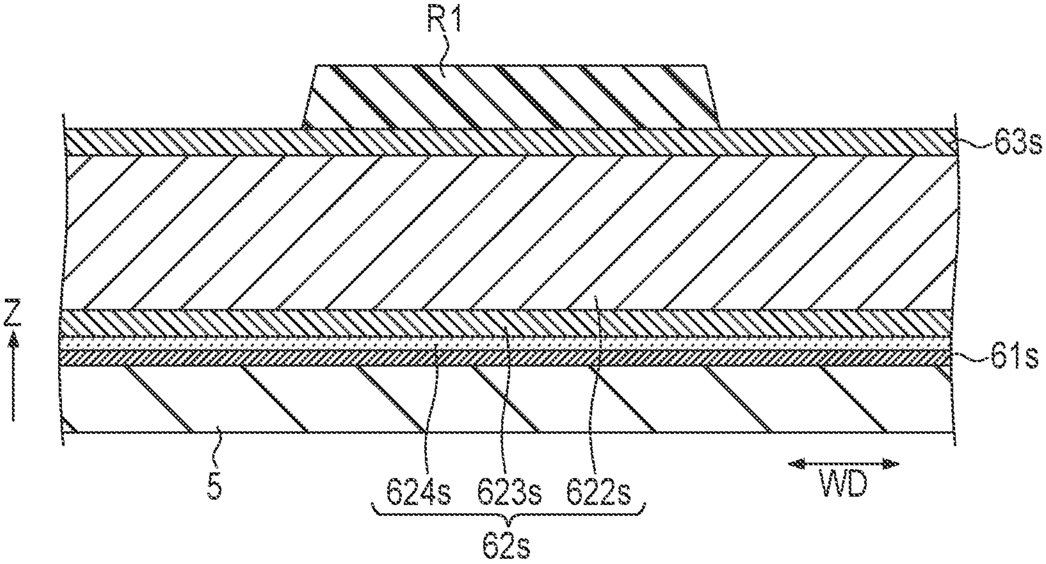
FIG. 27A is a diagram showing the process of forming the partition according to the eleventh embodiment.

FIG. 27A to FIG. 27D are diagrams showing an example of the process of forming the partition 6 according to the present embodiment. First, as shown in FIG. 27A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s*, a titanium layer 623*s* and a conductive oxide layer 624*s*.

Figure 27B:
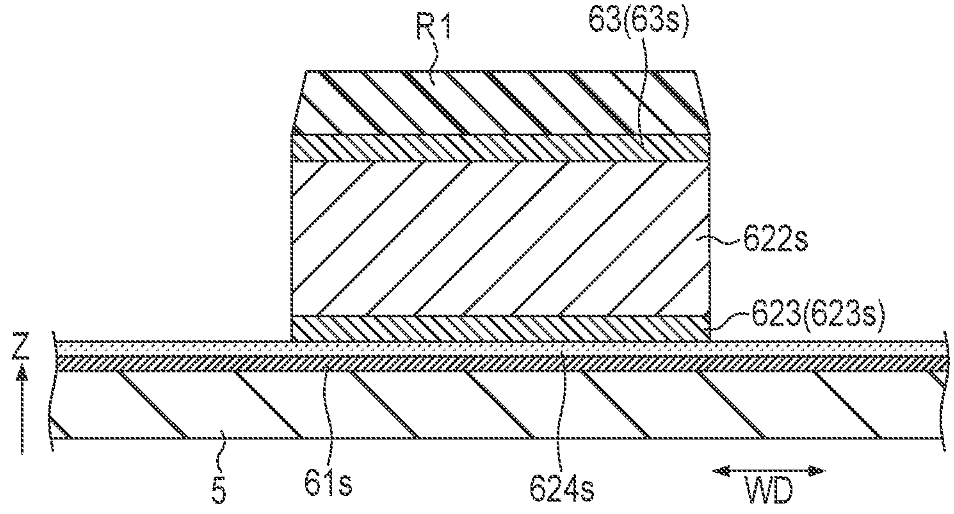
FIG. 27B is a diagram showing a process following FIG. 27A.

Subsequently, anisotropic dry etching employing, for example, a chlorine-based etching gas, is applied using the resist R1 as a mask. As shown in FIG. 27B, of the third layer 63*s*, the portion exposed from the resist R1 is removed. By this process, the third portion 63 having the shape shown in FIG. 26 is formed. In this dry etching, of the aluminum layer 622*s* and the titanium layer 623*s*, the portions exposed from the resist R1 are also removed. The conductive oxide layer 624*s* functions as an etching stopper of the dry etching.

Figure 27C:
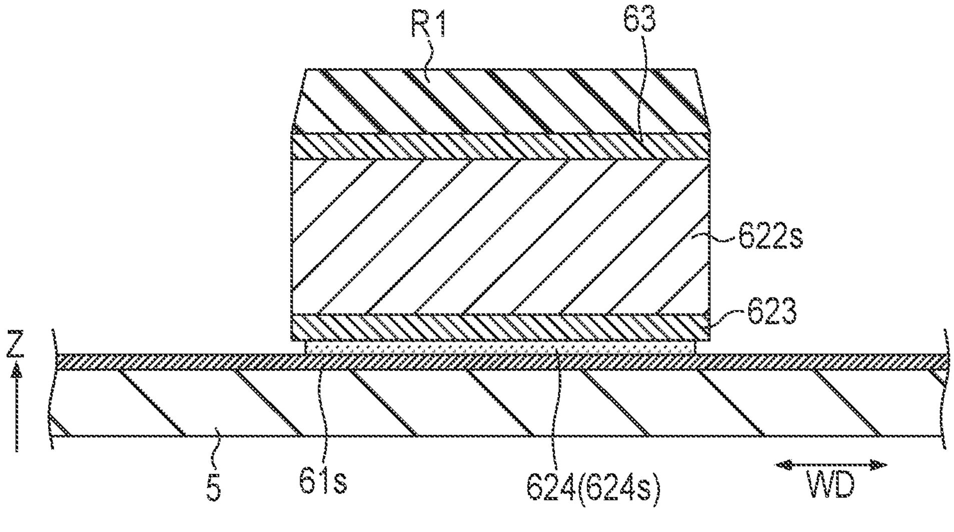
FIG. 27C is a diagram showing a process following FIG. 27B.

Subsequently, isotropic wet etching is applied. As shown in FIG. 27C, of the conductive oxide layer 624*s*, the portion exposed from the titanium layer 623 is removed. By this process, the conductive oxide layer 624 having the shape shown in FIG. 26 is formed. In the example of FIG. 27C, the width of the conductive oxide layer 624 is slightly made less than that of the titanium layer 623 by the wet etching.

Figure 27D:
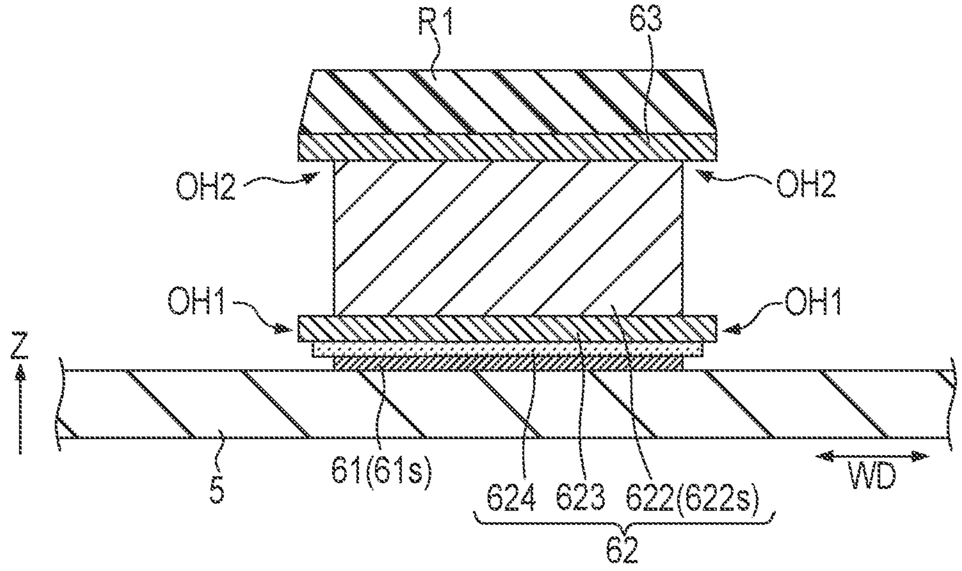
FIG. 27D is a diagram showing a process following FIG. 27C.

Subsequently, wet etching is applied again. For this wet etching, an etchant which corrodes the first layer 61*s* formed of molybdenum and the aluminum layer 622*s* and does not easily corrode the titanium layer 623, the conductive oxide layer 624 or the third portion 63 is used. By this process, as shown in FIG. 27D, the width of the aluminum layer 622*s* is reduced, and the second portion 62 including the aluminum layer 622, the titanium layer 623 and the conductive oxide layer 624 having the shapes shown in FIG. 26 is formed. Further, of the first layer 61*s*, the portion exposed from the conductive oxide layer 624 is removed, and the width of the first layer 61*s* is reduced under the conductive oxide layer 624, and the first portion 61 and the first overhang structures OH1 having the shapes shown in FIG. 26 are formed. Subsequently, the partition 6 is completed by removing the resist R1.

In a case where the second portion 62 includes the conductive oxide layer 624 like the present embodiment, even if the titanium layer 623 is damaged through the etching processes, the first overhang structures OH1 can be maintained by the conductive oxide layer 624.

Twelfth Embodiment

Figure 28:
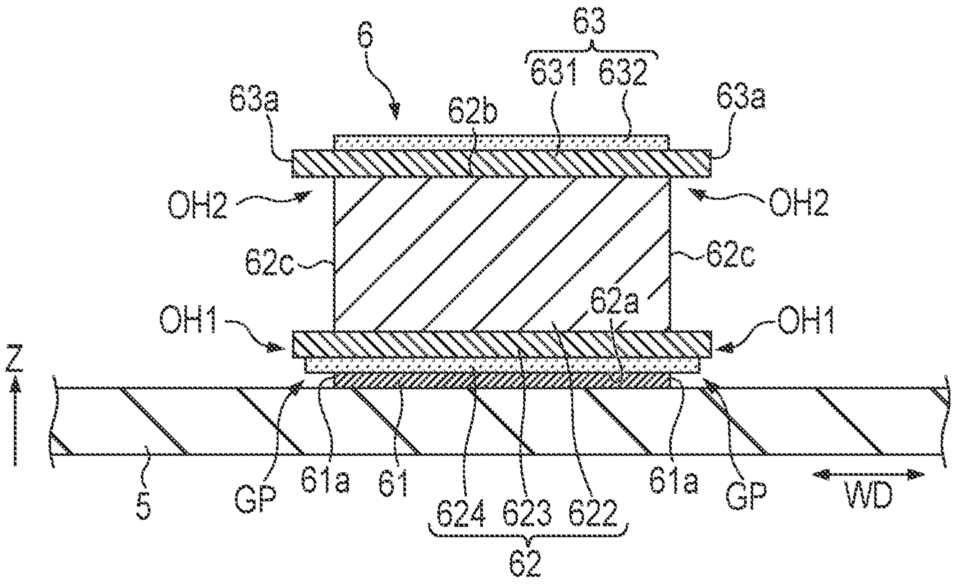
FIG. 28 is a schematic cross-sectional view of a partition according to a twelfth embodiment.

FIG. 28 is a schematic cross-sectional view of a partition 6 according to the twelfth embodiment. In the partition 6 of the present embodiment, in a manner similar to that of the partition 6 of the eleventh embodiment shown in FIG. 26, a second portion 62 includes an aluminum layer 622, a titanium layer 623 and a conductive oxide layer 624. Further, in the present embodiment, a third portion 63 includes a titanium layer 631 and a conductive oxide layer 632. A first portion 61 is formed of molybdenum. A rib 5 is formed of, for example, silicon nitride or silicon oxynitride.

For example, the thickness of the first portion 61 is 20 nm. The thickness of the conductive oxide layer 624 is 50 nm. The thickness of the titanium layer 623 is 100 nm. The thickness of the aluminum layer 622 is 500 nm. The thickness of the titanium layer 631 is 100 nm. The thickness of the conductive oxide layer 632 is 50 nm.

Figure 29A:
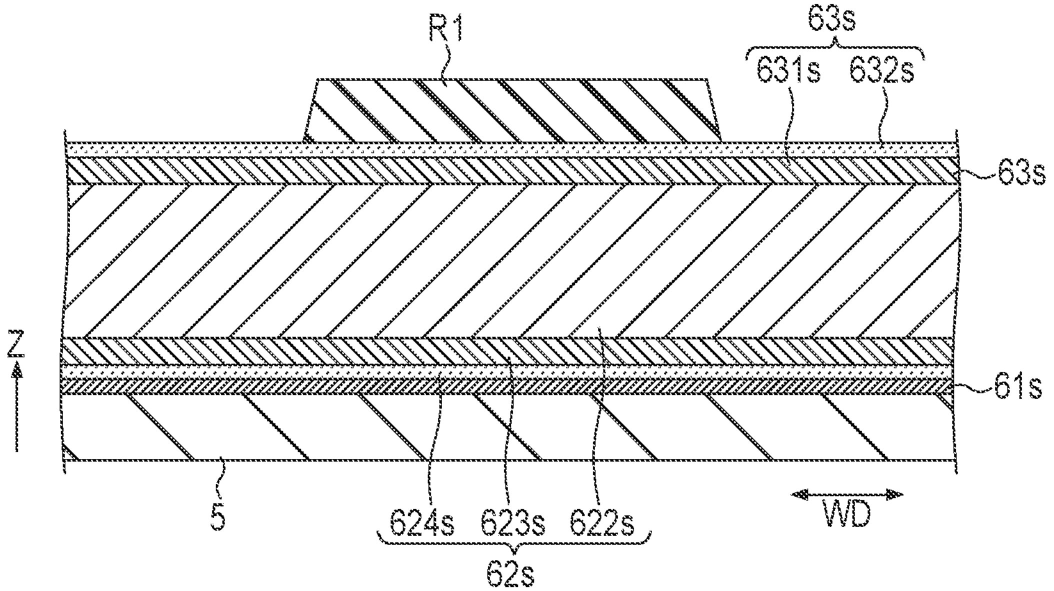
FIG. 29A is a diagram showing the process of forming the partition according to the twelfth embodiment.

FIG. 29A to FIG. 29E are diagrams showing an example of the process of forming the partition 6 according to the present embodiment. First, as shown in FIG. 29A, a first layer 61*s* which is the base of the first portion 61, a second layer 62*s* which is the base of the second portion 62, a third layer 63*s* which is the base of the third portion 63 and a resist R1 are formed in order above the rib 5. The second layer 62*s* includes an aluminum layer 622*s*, a titanium layer 623*s* and a conductive oxide layer 624*s*. The third layer 63*s* includes a titanium layer 631*s* and a conductive oxide layer 632*s*.

Figure 29B:
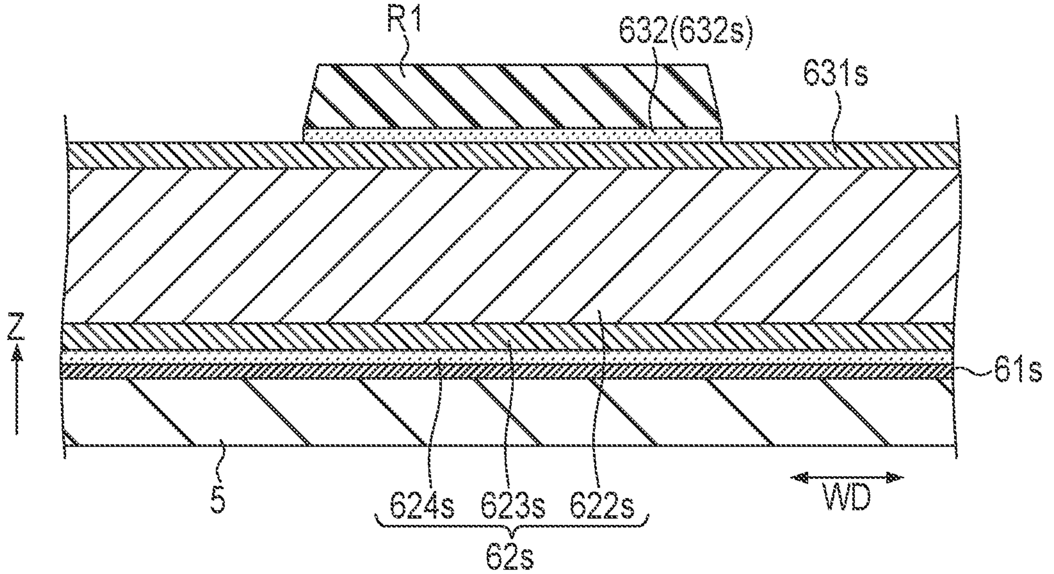
FIG. 29B is a diagram showing a process following FIG. 29A.

Subsequently, wet etching is applied using the resist R1 as a mask. As shown in FIG. 29B, of the conductive oxide layer 632*s*, the portion exposed from the resist R1 is removed. By this process, the conductive oxide layer 632 having the shape shown in FIG. 28 is formed.

Figure 29C:
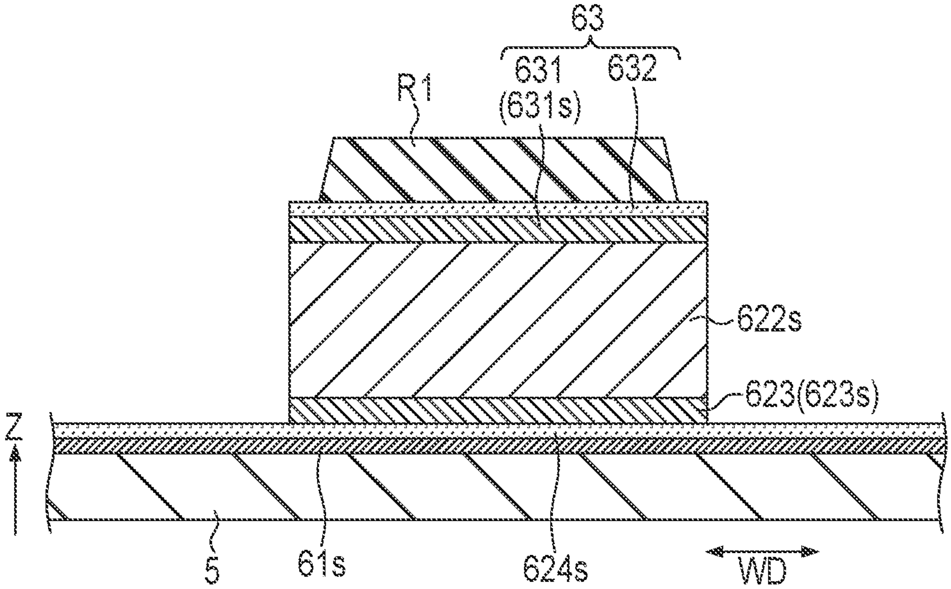
FIG. 29C is a diagram showing a process following FIG. 29B.

Further, anisotropic dry etching employing, for example, a chlorine-based etching gas, is applied using the resist R1 as a mask. As shown in FIG. 29C, of the titanium layer 631*s*, the portion exposed from the resist R1 is removed. By this process, the third portion 63 including the titanium layer 631 and the conductive oxide layer 632 having the shapes shown in FIG. 28 is formed. In this dry etching, of the aluminum layer 622*s* and the titanium layer 623*s*, the portions exposed from the resist R1 are also removed. The conductive oxide layer 624*s* functions as an etching stopper of the dry etching.

Figure 29D:
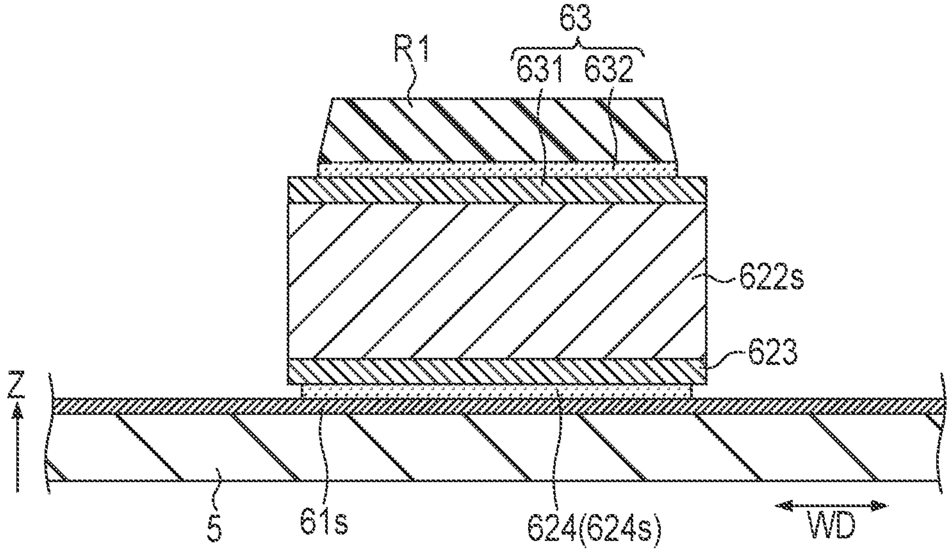
FIG. 29D is a diagram showing a process following FIG. 29C.

Subsequently, isotropic wet etching is applied. As shown in FIG. 29D, of the conductive oxide layer 624*s*, the portion exposed from the titanium layer 623 is removed. By this process, the conductive oxide layer 624 having the shape shown in FIG. 28 is formed.

Figure 29E:
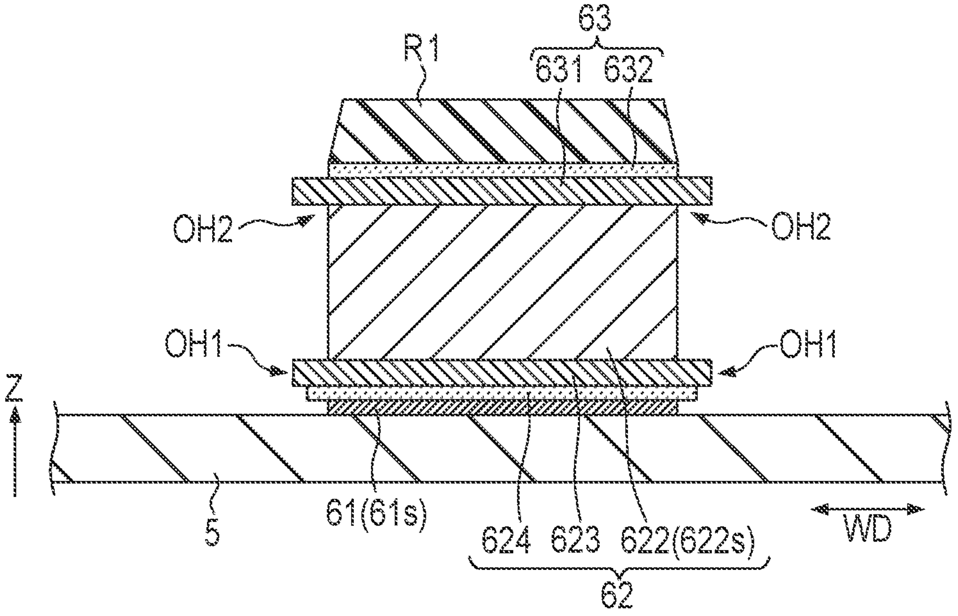
FIG. 29E is a diagram showing a process following FIG. 29D.

Subsequently, wet etching is applied again. For this wet etching, an etchant which corrodes the first layer 61*s* formed of molybdenum and the aluminum layer 622*s* and does not easily corrode the titanium layer 623 or 631 or the conductive oxide layer 624 or 632 is used. By this process, as shown in FIG. 29E, the width of the aluminum layer 622*s* is reduced, and the second portion 62 including the aluminum layer 622, the titanium layer 623 and the conductive oxide layer 624 having the shapes shown in FIG. 28 is formed. Further, of the first layer 61*s*, the portion exposed from the conductive oxide layer 624 is removed, and the width of the first layer 61*s* is reduced under the conductive oxide layer 624. The first portion 61 and first overhang structures OH1 having the shapes shown in FIG. 28 are formed. Subsequently, the partition 6 is completed by removing the resist R1.

In addition to the methods disclosed in the first to twelfth embodiments, various other methods can be used to form the first overhang structures OH1 and the second overhang structures OH2 in the partition 6.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib comprising a pixel aperture overlapping the lower electrode;
a partition provided on the rib;
an upper electrode facing the lower electrode; and
an organic layer which is located between the lower electrode and the upper electrode and emits light based on a potential difference between the lower electrode and the upper electrode, wherein
the partition comprises:
a conductive first portion provided on the rib;
a conductive second portion which is provided on the first portion and is in contact with the upper electrode; and
a third portion provided on the second portion,
a lower end of the second portion protrudes in a width direction of the partition relative to the first portion,
the third portion protrudes in the width direction relative to an upper end of the second portion, and
the second portion is thicker than the first portion and the third portion,
wherein a thickness (T1) of the first portion, a protrusion length (D1) of the lower end of the second portion from the first portion, and a protrusion length (D2) of the third portion from the upper end of the second portion satisfy $D1 \geq 2 \times T1$ and $D1 \geq D2$.

2. The display device of claim 1, wherein
the partition surrounds the pixel aperture.

3. The display device of claim 1, wherein
the organic layer consists of a plurality of layers including a hole injection layer which covers the lower electrode, and
the hole injection layer is spaced apart from the second portion.

4. The display device of claim 3, wherein
the first portion is thicker than the hole injection layer.

5. The display device of claim 3, wherein
a gap between the lower end of the second portion and the rib is blocked by the layer included in the plurality of layers and provided on the hole injection layer.

6. The display device of claim 5, wherein
the plurality of layers include a hole transport layer, an electron blocking layer, a light emitting layer, a hole blocking layer, an electron transport layer and an electron injection layer above the hole injection layer.

7. The display device of claim 1, wherein
the first portion is formed of molybdenum,
the second portion is formed of aluminum, and
the third portion is formed of titanium.

8. The display device of claim 1, wherein
the first portion is formed of molybdenum,
the second portion is formed of aluminum, and
the third portion includes a titanium layer, and a conductive oxide layer provided on the titanium layer.

9. The display device of claim 1, wherein
the first portion is formed of aluminum,
the second portion includes a titanium layer, and an aluminum layer provided on the titanium layer, and
the third portion is formed of titanium.

10. The display device of claim 1, wherein
the first portion is formed of conductive oxide,
the second portion includes a titanium layer, and an aluminum layer provided on the titanium layer, and
the third portion is formed of titanium.

11. A manufacturing method of a display device, including:
forming a lower electrode;
forming a rib which covers at least part of the lower electrode;
forming a partition on the rib, the partition comprising a conductive first portion, a conductive second portion provided on the first portion and a third portion provided on the second portion, the second portion comprising a lower end protruding in a width direction relative to the first portion, the third portion protruding in the width direction relative to an upper end of the second portion;
forming an organic layer which covers the lower electrode through a pixel aperture provided in the rib; and
forming an upper electrode which covers the organic layer and is in contact with the second portion, wherein
forming the partition includes:
forming a first layer which is a base of the first portion;
forming a second layer which is a base of the second portion on the first layer;
forming a third layer which is a base of the third portion on the second layer;
providing a resist on the third layer; and
forming the first portion, the second portion and the third portion by etching to remove, of the first layer, the second layer and the third layer, a portion exposed from the resist to and reduce widths of the first layer and the second layer, such that a thickness (T1) of the first portion, a protrusion length (D1) of the lower end of the second portion from the first portion, and a protrusion length (D2) of the third portion from the upper end of the second portion satisfy $D1 \geq 2 \times T1$ and $D1 \geq D2$.

12. The manufacturing method of claim 11, wherein
the organic layer is formed by stacking a plurality of layers including a hole injection layer, and
the hole injection layer is spaced apart from the second portion.

13. The manufacturing method of claim 12, further including
blocking a gap between the lower end of the second portion and the rib by the layer included in the plurality of layers and formed after the hole injection layer.

* * * * *